United States Patent
Ernst et al.

(10) Patent No.: US 8,492,232 B2
(45) Date of Patent: Jul. 23, 2013

(54) PRODUCTION OF A TRANSISTOR GATE ON A MULTIBRANCH CHANNEL STRUCTURE AND MEANS FOR ISOLATING THIS GATE FROM THE SOURCE AND DRAIN REGIONS

(75) Inventors: Thomas Ernst, Morette (FR); Christian Isheden, Dresden (DE)

(73) Assignee: Commissariat a l'Energie Atomique, Paris (FR)

( * ) Notice: Subject to any disclaimer, the term of this patent is extended or adjusted under 35 U.S.C. 154(b) by 56 days.

(21) Appl. No.: 13/190,125

(22) Filed: Jul. 25, 2011

(65) Prior Publication Data
US 2011/0281412 A1 Nov. 17, 2011

Related U.S. Application Data

(62) Division of application No. 12/097,411, filed as application No. PCT/EP2006/070255 on Dec. 28, 2006, now abandoned.

(30) Foreign Application Priority Data

Dec. 30, 2005 (FR) ...................................... 05 54151

(51) Int. Cl.
*H01L 21/336* (2006.01)
(52) U.S. Cl.
USPC .................................... 438/284; 257/E21.409
(58) Field of Classification Search
USPC .......................................................... 438/284
See application file for complete search history.

(56) References Cited

U.S. PATENT DOCUMENTS

| 5,675,164 A | 10/1997 | Brunner et al. |
| 5,780,911 A | 7/1998 | Park et al. |
| 5,965,914 A | 10/1999 | Miyamoto |

(Continued)

FOREIGN PATENT DOCUMENTS

| FR | 2 861 501 | 4/2005 |
| WO | WO 2004/107399 A2 | 12/2004 |

(Continued)

OTHER PUBLICATIONS

F. Secco d' Aragona, "Dislocation Etch for (100) Planes in Silicon", J. Electrochem. Soc. Solid-State Science and Technology, vol. 119, No. 7, Jul. 1972, pp. 948-951.

(Continued)

*Primary Examiner* — Wensing Kuo
(74) *Attorney, Agent, or Firm* — Oblon, Spivak, McClelland, Maier & Neustadt, L.L.P.

(57) ABSTRACT

A method for fabricating a microelectronic device comprising: a support, an etched stack of thin layers comprising: at least one first block and at least one second block resting on the support, in which at least one drain region and at least one source region, respectively, are capable of being formed, several semiconductor bars connecting a first zone of the first block and another zone of the second block, and able to form a multi-branch transistor channel, or several transistor channels, the device also comprising: a gate surrounding said bars and located between said first block and said second block, the gate being in contact with a first and a second insulating spacer in contact with at least one sidewall of the first block and with at least one sidewall of the second block, respectively, and at least partially separated from the first block and the second block, via said insulating spacers.

18 Claims, 41 Drawing Sheets

U.S. PATENT DOCUMENTS

| | | | |
|---|---|---|---|
| 5,968,710 A * | 10/1999 | Whitman et al. | 430/296 |
| 6,355,532 B1 | 3/2002 | Seliskar et al. | |
| 6,413,802 B1 | 7/2002 | Hu et al. | |
| 6,562,665 B1 | 5/2003 | Yu | |
| 6,720,702 B2 | 4/2004 | Knauff | |
| 6,762,448 B1 | 7/2004 | Lin et al. | |
| 6,787,402 B1 | 9/2004 | Yu | |
| 6,855,588 B1 | 2/2005 | Liao et al. | |
| 6,911,697 B1 | 6/2005 | Wang et al. | |
| 7,354,831 B2 * | 4/2008 | Orlowski | 438/283 |
| 7,910,917 B2 | 3/2011 | Ernst et al. | |
| 2002/0093053 A1 | 7/2002 | Chan et al. | |
| 2003/0008515 A1 | 1/2003 | Chen et al. | |
| 2003/0215989 A1 | 11/2003 | Kim et al. | |
| 2004/0063286 A1 | 4/2004 | Kim et al. | |
| 2004/0092060 A1 | 5/2004 | Gambino et al. | |
| 2004/0262690 A1 | 12/2004 | Coronel et al. | |
| 2005/0094434 A1 | 5/2005 | Watanabe et al. | |
| 2005/0161739 A1 | 7/2005 | Anderson et al. | |
| 2005/0285186 A1 | 12/2005 | Fujiwara | |
| 2006/0216897 A1 * | 9/2006 | Lee et al. | 438/282 |
| 2011/0067985 A1 | 3/2011 | Gabriel | |
| 2011/0124161 A1 | 5/2011 | Ernst et al. | |

FOREIGN PATENT DOCUMENTS

| | | |
|---|---|---|
| WO | WO 2005/010994 A1 | 2/2005 |
| WO | WO 2006/087381 A1 | 8/2006 |
| WO | WO 2006/108987 A1 | 10/2006 |

OTHER PUBLICATIONS

Jean-Pierre Colinge, et al., "Future SOI Technology and Devices", Extended Abstracts of the 2001 International Conference on Solid State Devices and Materials, Japan Society of Applied Physics, Tokyo, Sep. 26, 2001, pp. 238-239.

Sung-Young Lee, et al, A Novel Multibridge-Channel MOSFET (MBCFET): Fabrication Technologies and Characteristics, IEEE Transactions on Nanotechonology, vol. 2, No. 4, Dec. 2003, pp. 253-257.

Mamoru Terauchi, A Novel 4T SRAM Cell Using "Self-Body-Biased SOI MOSFET Structure Operating at 0.5 Volt", 2000 IEEE International SOI Conference, Oct. 2000, pp. 108-109.

W. Hansch, et al., "Carrier Transport Near the $Si/SiO_2$ Interface of a Mosfet", Solid-State Electronics, vol. 32, No. 10, 1989, pp. 839-849.

Andreas Tsormpatzoglou, et al., "Semi-Analytical Modeling of Short-Channel Effects in Si and Ge Symmetrical Double-Gate MOSFETs", IEEE Transactions on Electron Devices, vol. 54, No. 8, Aug. 2007, pp. 1943-1952.

Hyung-Kyu Lim, "Threshold Voltage of Thin-Film Silicon-on-Insulator (SO( ) MOSFET's", IEEE Transactions on electron Devices, vol. ED-30, No. 10, Oct. 1983, pp. 1244-1251.

Sung-Young Lee, et al., "Sub-25nm Single-Metal Gate CMOS Multi-Bridge-Channel MOSFET (MBCFET) for High Performance and Low Power Application", 2005 Symposium on VLSI Technology Digest of Technical Papers, 9A-1, pp. 154-155.

* cited by examiner

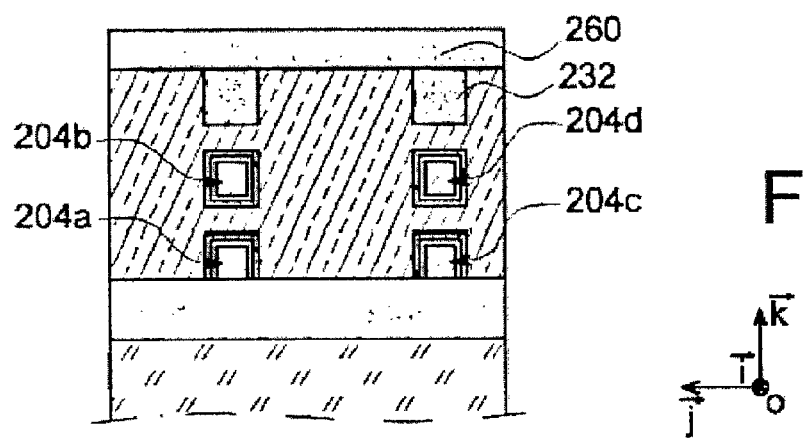

PRODUCTION OF A TRANSISTOR GATE ON A MULTIBRANCH CHANNEL STRUCTURE AND MEANS FOR ISOLATING THIS GATE FROM THE SOURCE AND DRAIN REGIONS

CROSS REFERENCE TO RELATED APPLICATION

The present divisional application claims the benefit of priority under 35 U.S.C. 120 to application Ser. No. 12/097,411, filed Jun. 13, 2008, which is the National Stage of International Application No. PCT/EP2006/070255, filed on Dec. 23, 2006, and claims the benefit of priority under 35 U.S.C. 119 from French Application No. 05 54151, filed on Dec. 30, 2005. application Ser. No. 12/097,411 is hereby incorporated by reference in its entirety.

DESCRIPTION

1. Technical Field

The present invention relates to the field of integrated circuits, and more particularly that of transistors, and aims to present a microelectronic device provided in particular with a multi-branch channel structure, or a multi-channel structure, and a so-called "surrounding" gate having a uniform critical dimension as well as means to insulate this gate from the source and drain regions, the device being improved in terms of electrical performances, in particular with regard to the parasitic capacitances between the gate and the source and drain regions. The invention also includes a method for fabricating a device of this type.

2. Prior Art

A traditional transistor structure is generally formed, on a substrate, for example of the SOI (silicon on insulator) type, by a source region and a drain region, for example in the form of a first and a second semiconductor zone, respectively, these zones being connected to each other via a third semiconductor structure intended to play the role of a channel or several channels in which a current is intended to circulate, and which may have the form of a block or a bar, or possibly several disconnected semiconductor bars. This or these semi-conductive bar(s) are covered by a gate making it possible to control the intensity of a current passing through the channel or possibly in the channels between the source region and the drain region.

Document U.S. Pat. No. 6,855,588 presents, for example, a transistor equipped with a specific gate, called "trigate". The gate of this transistor is formed above as well as on the sidewalls of a parallelepiped semiconductor bar, so as to obtain a covering area of the gate on the most important channel in relation to a traditional MOS transistor, a significant covering area making it possible to obtain improved control of the conduction of the channel, in particular for gates having nanoscale dimensions.

There are also transistor gates called "surrounding" or GAA (gate all around) for which the gate material is formed all around a portion of the channel semiconductor block, and produces, for example, a ring around this block. Document US 2004/0063286 A1 presents, for example, a transistor comprising this type of gate. This transistor is equipped with a channel structure, formed by superposed parallelepiped semiconductor bars, and produced such that an opening exists between the bars. The parallelepiped semiconductor bars are also surrounded over part of their length by a gate material filling in the openings located between the bars. The fabrication of the "surrounding" gate uses a microelectronic method of the Damascene type. The gate structure obtained using this type of method comprises overlap parasitic capacitances between the gate and the source and drain regions, which damage the electrical performance of the transistor.

The problem arises of finding a new microelectronic device comprising a channel structure transistor comprising several branches or with a multi-channel structure, provided with a "surrounding" or "semi-surrounding" gate, which does not comprise the abovementioned drawbacks, as well as a method making it possible to implement a device of this type.

DESCRIPTION OF THE INVENTION

The present invention aims to present a microelectronic device provided in particular with a multi-branch channel structure, or a multi-channel structure, and a "surrounding" gate of uniform slope as well as means for isolating the gate from the source and drain regions.

The invention more particularly concerns a microelectronic device comprising:
 a support,
 an etched thin-film stack resting on the support and comprising: at least one first block and at least one second block, in which blocks, respectively, at least one drain region and at least one source region are capable of being formed, as well as one or several semiconductor bars connecting a first zone of the first block and another zone of the second block, the semiconductor bars being capable of forming a transistor channel, or several transistor channels,
 a gate at least partially surrounding said bars and located between said first block and said second block,
 at least one first insulating zone formed against at least one sidewall of the first block,
 at least one second insulating zone across from the first insulating zone, the second insulating zone being formed against at least one sidewall of the second block, the gate being in contact with the first insulating zone and the second insulating zone and at least partially separated or totally separated from the first block and the second block, via said first and second insulating zones.

According to one possibility, the first insulating zone and the second insulating zone can rest on the support.

The semiconductor bars can go through the first insulating zone and the second insulating zone.

The stack can rest on a dielectric layer of a substrate of the semiconductor on insulator type, for example of the SOI (Silicon On Insulator) type. In this case, the first insulating zone and the second insulating zone may rest on the dielectric layer of the support.

According to one possibility, at least one bar among said semiconductor bars, or each of the semiconductor bars, is suspended above the support between said first block and said second block, and/or is separated or separated from the support.

According to one possibility which can be combined with the preceding, at least two of said semiconductor bars can be aligned in a direction parallel to the primary plane of the support.

According to another possibility that can be combined with the preceding, the device can comprise, among said semiconductor bars, at least two separated semiconductor bars, and which are aligned in a direction fabricating a non-null angle with the primary plane of the support.

The stack, and in particular said first block and said second block, can be formed by at least one layer based on a first semiconductor material, and at least one layer based on a second material, different from the first semiconductor material.

According to one particular embodiment, the stack and in particular the first block and the second block, can then be formed by an alternation of layers based on a first semiconductor material and layers based on a second material, different from the first semiconductor material.

Said second material can be chosen so as to be able to be selectively etched in relation to the first material. Said second material can have a different doping than the first material and/or be based on a semiconductor different from the first material, and/or have a different stoichiometry than that of the first material.

According to one possibility, the second material and/or the first material can be a given semiconductor comprising an additive, the additive being formed by atoms of a size different from that of said semiconductor, the additive being made up of smaller atoms than the atoms of said given semiconductor for example when said given semiconductor is stressed in biaxial compression in the plane of the support, or being made up of atoms larger than the atoms of said given semiconductor, for example when said given semiconductor is stressed in biaxial tension in the plane of the support. In the case where the given material is SiGe in biaxial compression, the additive can for example be in the form of carbon or boron atoms. The presence of this type of additive in the first material or in the second material may make it possible to offset the stress that one of said first material and second material applies on the other of said first material and second material, and make it possible to have a stack provided with a high number of thin layers, without the electrical properties of the device being altered.

The first insulating zone and the second insulating zone can be separated between the first block and the second block by a constant distance equal to the critical dimension of the gate. One will understand, throughout the present description, that "critical dimension" refers to the minimal dimension of a geometric pattern produced in a thin layer or in a stack of thin layers, outside the dimension(s) defined by the thickness of this thin layer or this stack of thin layers.

According to a first embodiment, the invention concerns a method for fabricating a microelectronic device the steps of:
a) forming, from a thin film stack on a support, the stack comprising at least two successive layers based on at least one first semiconductor material and at least one second material, different from the first material, respectively, at least one first block designed to form at least one transistor source region, and at least one second block designed to form at least one transistor drain region and at least one structure connecting said first block and said second block,
b) formation, in a region located between the first block and the second semiconductor, of at least one first insulating zone against a sidewall of said first block and at least one second insulating zone against a sidewall of the second block, and at least one cavity comprising at least one gate pattern between the first insulating zone and the second insulating zone,
c) selective removal, in the cavity, of the second material with regard to the first semiconductor material,
d) deposition in the cavity of at least one gate dielectric and at least one gate material.

Thus, according to the invention, one forms insulating zones designed to play the role of spacers against a source region block and another drain region block, the insulating zones being separated by a gate-shaped cavity, then, one produces a gate in said cavity.

The support may for example comprise a dielectric layer of a semiconductor on insulator-type substrate.

Said second material may be different from said first material and chosen so as to be able to be selectively etched in relation to the first material. Said second material may have a different doping than the first material and/or be at the base of a semiconductor different from the first material, and/or have a different stoichiometry from that of the first material. The first semiconductor material may for example be Si, while the second semiconductor material may for example be SiGe.

According to one possibility, the stack of thin layers can be produced via epitaxy.

According to one possible embodiment, the thin-film stack can be made up of an alternation of layers based on a first semiconductor material and layers based on the second material.

According to one possible embodiment, said cavity can also comprise at least one transistor gate contact pattern. According to one variation, the method can comprise the formation of at least one transistor gate contact by etching of said gate material.

The insulating zones formed in step b) can rest on the substrate, for example on the dielectric layer of the substrate when this substrate is of the semiconductor on insulating type. The gate formed in the cavity can thus be completely isolated or separated from the source and drain semiconductor blocks via the insulating blocks formed in step b).

According to one possible embodiment, the formation of the insulating zones in step b) can comprise the deposition of an insulating layer, then removal of part of the insulating layer, for example using at least one electron beam.

According to this first embodiment, the formation of insulating zones and the cavity in step b) can comprise:
  the deposition of a layer based on a dielectric material on the substrate,
  exposing part of said layer of dielectric material using an electron beam. This may enable the formation of a cavity having a uniform width or critical dimension. Said dielectric material exposed to the electron beam can be an electron beam-sensitive dielectric material, for example HSQ (hydrogen silsesquioxane).

According to a second embodiment, the invention concerns a method for fabricating a microelectronic device comprising the steps of:
a) forming, from a thin-film stack on a substrate, the stack comprising at least two successive films based on at least one first semiconductor material and at least one second material different from the first material, respectively, at least one first block designed to form at least one transistor source region, and at least one second block designed to form at least one transistor drain region, and at least one structure connecting said first block and said second block,
b) formation on the stack of an insulating mask comprising at least one opening, said opening comprising at least one transistor gate pattern,
c) selective removal, through said opening, of the second material with regard to said first semiconductor material,
d) deposition in the opening of at least one gate dielectric and at least one gate material,
e) partial removal of the insulating mask, so as to keep insulating blocks resulting from the mask in contact with the gate.

The removal in step c) can comprise etching of the insulating mask above, the first block and the second block, as well as the structure connecting said first block and said second block.

Said structure can comprise at least two disconnected blocks.

According to one advantageous embodiment, the film of the stack which is in contact with the support, is a sacrificial layer based on the second material. This can make it possible to form semiconductor bars which are not in contact with the support and a totally surrounding gate, forming a ring around each of said semiconductor bars.

According to one variation for which the support comprises a dielectric film whereon said stack is formed, the method can also comprise: after step b) and before step d), a partial removal of the dielectric layer through the cavity. This can also make it possible to form semiconductor bars which are not in contact with the support and a totally surrounding gate, forming a ring around each of said semiconductor bars.

According to one possibility, after step c), and before step d), the method can include deposition of at least one gate dielectric material through the opening or in the cavity.

According to one possible embodiment, step d) can comprise the deposition of at least one first metallic gate material, then filling of the cavity by at least one second semiconductor gate material.

According to one variation, step b) for formation of the insulating mask provided with at least one cavity, can comprise the steps of:
- depositing a first dielectric material,
- lithography of the first dielectric material using at least one electron beam, so as to form at least one transistor gate pattern,
- formation of a second dielectric material, on both sides of the pattern based on the first dielectric material,
- removal of the pattern based on the first dielectric material.

According to this variation, the method can also comprise: prior to deposition of the first dielectric material, deposition of a protective layer based on another dielectric material, and after removal of said pattern based on the first dielectric material, the removal of part of the insulating protective layer in the extension of said pattern based on the first dielectric material.

Said first dielectric material can for example be HSQ (hydrogen silsesquioxane).

The method can also comprise at least one step for doping of the first block and the second block, so as to form a source region in the first block and a drain region in the second block.

The first insulating zone and the second insulating zone formed, can be separated by a constant distance equal to the critical dimension of the gate which one forms in particular by filling the cavity.

BRIEF DESCRIPTION OF THE DRAWINGS

The present invention will be better understood upon reading the description of given embodiments, purely for information and in no way exhaustively, in reference to the appended drawings in which:

FIGS. 4A to 4G, 5A to 5G, 6A to 6G, illustrate a second example of a microelectronic method according to the invention, comprising the production of insulating spacers for the "surrounding" gate of a transistor, then the production of the gate between these insulating spacers;

Identical, similar or equivalent parts of the various figures bear the same numeric references so as to facilitate the passage from one figure to the next.

The different parts illustrated in the figures are not necessarily on a uniform scale, to make the figures more readable.

DETAILED DESCRIPTION OF PARTICULAR EMBODIMENTS

One example of the method according to the invention for fabricating a microelectronic device and in particular a "gate all-around" for a transistor comprising a multi-branch channel structure or a structure comprising several channels or a "multi-channel" structure, will now be given in connection with FIGS. 1A-1G; 2A-2G, 3A-3G (FIGS. 1A-1G showing a top view of a microelectronic device during production, while FIGS. 2A-2G show cross-sectional views of the microelectronic device during production along a cutting plane going through an axis X'X and parallel to a plane [O; $\vec{i}$; $\vec{k}$]; of an orthogonal reference [O; $\vec{i}$; $\vec{j}$; $\vec{k}$], and FIGS. 3A-3G show other cross-sectional views of the microelectronic device during production according to another cutting plane going through an axis Y'Y and parallel to a plane [O; $\vec{j}$; $\vec{k}$] of an orthogonal reference [O; $\vec{i}$; $\vec{j}$; $\vec{k}$]).

One first produces a thin-film stack 105 on a substrate 100, which can be of the semiconductor on insulator type and comprise a "support" layer 101, for example silicon-based, whereon rests a dielectric layer 102, for example a buried oxide layer) based on $SiO_2$. The dielectric layer 102 can be covered by a layer $104_1$, based on a first material, which can be semiconductor. Several other layers $106_1$, $104_2$, $106_2$, are produced on the layer $104_1$ resting on the dielectric layer 102, for example through several successive epitaxies, and form a thin-film stack 105 with the latter on the insulating layer 102. The stack 105 can be formed by an alternation of layers $104_1$, $104_2$, based on the first material and wherein a transistor channel is intended to be formed, and "sacrificial" layers $106_1$, $106_2$, based on a second material different from said first material, respectively. The second material is a material chosen so as to be able to be selectively etched in relation to said first material. The second material may be semiconductor, for example. The first material can for example be Si, while the second material can for example be SiGe. The layers $104_1$, $106_1$, $104_2$, $106_2$ of the stack can each have a thickness for example between 10 and 50 nanometers.

Figure 1A:
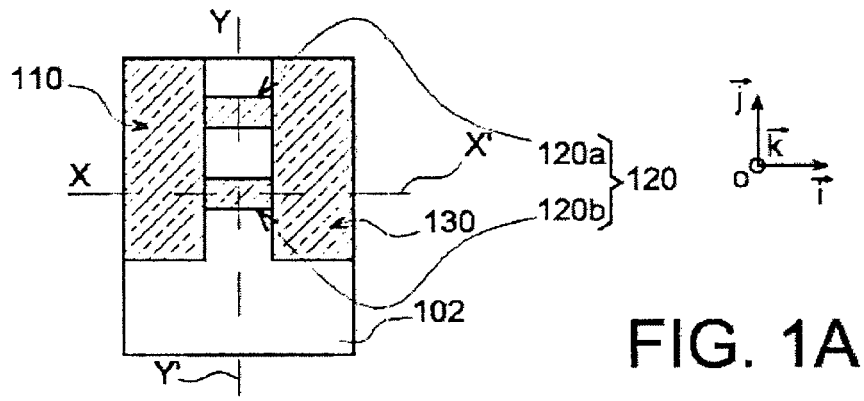
FIGS. 1A to 1G, 2A to 2G, 3A to 3G illustrate a first embodiment of a microelectronic method according to the invention, comprising the production of at least one "surrounding" transistor gate on a multi-branch transistor channel structure, and insulating spaces for this gate.
Figure 2A:
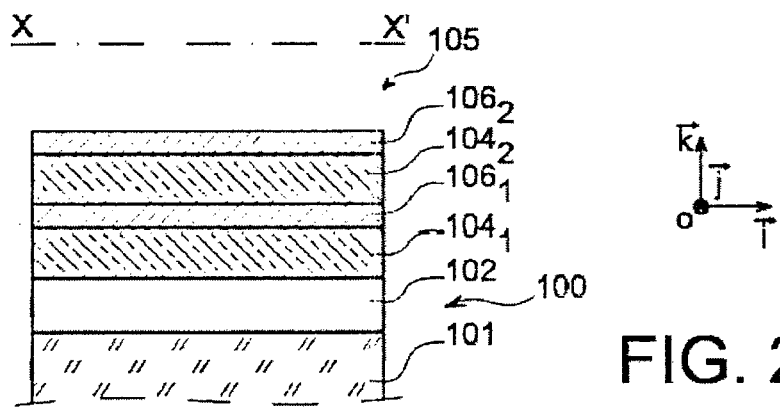
Figure 3A:
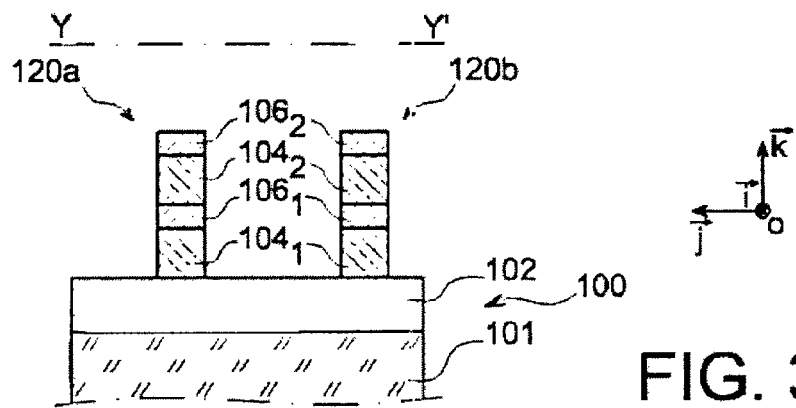

Once the stack 105 is produced, one etches said stack so as to form at least one first block intended to serve as the at least one transistor source region 110, at least one second block intended to serve as the at least one transistor drain region, as well as a structure 120 connecting the first block 110 and the second block 130. The structure 120 can be in the form of two other separated blocks 102a and 102b, connecting the first block 110 and the second block, and each made up of superposed bars. The etching of the stack 105 can be of the anisotropic type, and produced for example using a $CF_4$, HBr, $O_2$ based plasma, through a mask, for example through a resin, or a hard insulating mask based on $Si_3N_4$ or $SiO_2$ which may have been formed through photolithography then etching. FIGS. 1A, 2A and 3A show the etched stack 105, once the mask has been removed.

Figure 1B:
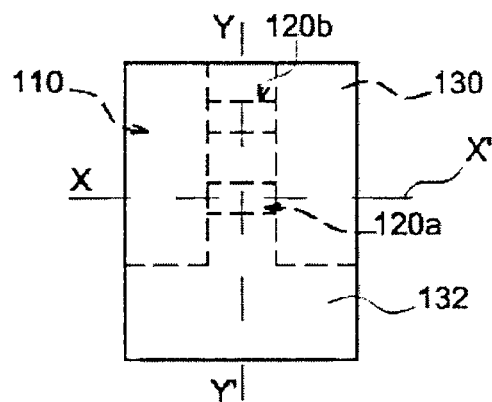
Figure 1B:
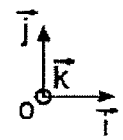
Figure 2B:
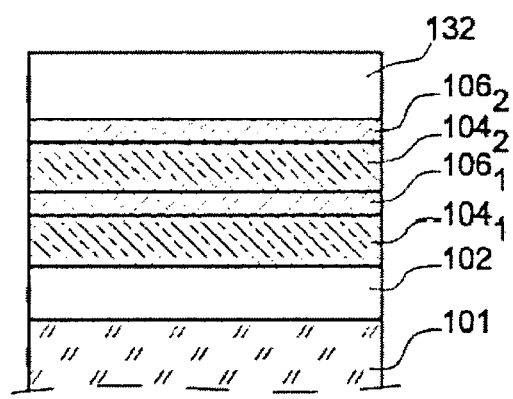
Figure 2B:
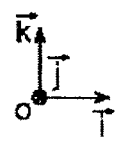
Figure 3B:
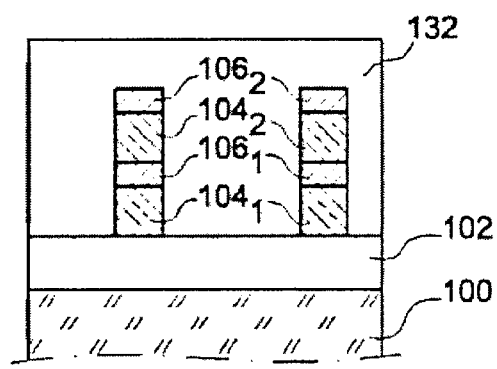
Figure 3B:
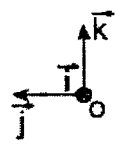
Figure 2C:
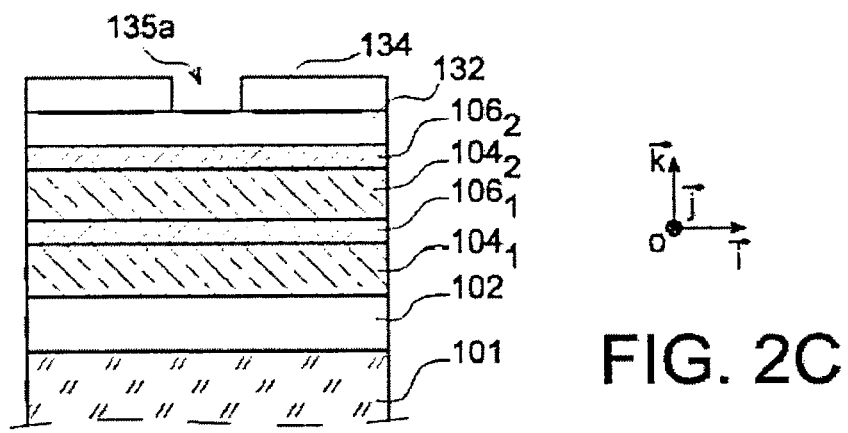
Figure 3C:
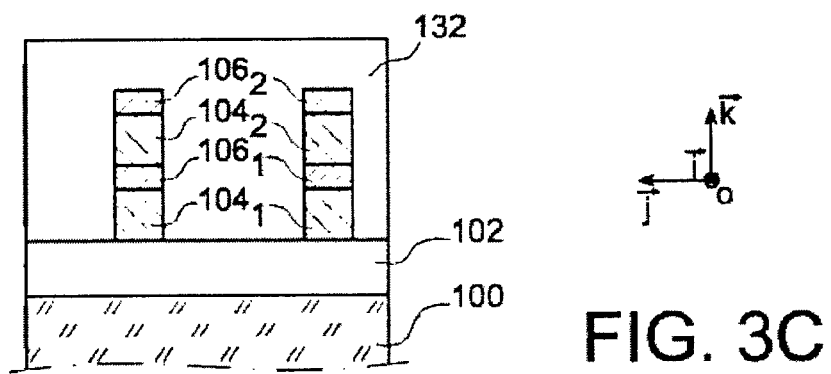

One then covers the etched stack 105 and the dielectric layer 102 of the substrate 100 with a first insulating layer 132, for example based on $Si_3N_4$. This first insulating layer 132 can be made through deposition, with a thickness greater than the height of the stack 105, for example a thickness between 50 and 500 nanometers, so as to completely cover the latter (FIGS. 1B, 2B, 3B).

One can then carry out a polishing step, for example by CMP (Chemical Mechanical Polishing) in order to smooth out the insulating layer 132 and reduce its thickness. One then creates at least one opening or one cavity 136 in the first insulating layer 132. The cavity formed comprises or produces at least one gate pattern 135a and possibly a gate contact pattern 135b. According to one possibility (FIGS. 1C, 2C, 3C), the gate 135a and contact 135b patterns can be produced beforehand through lithography or photolithography in the form of an opening in a layer 134, for example of resin produced on the insulating layer 132.

Figure 1C:
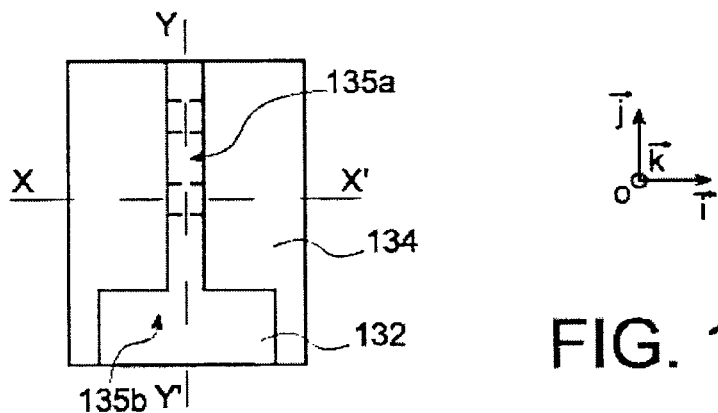
Figure 1D:
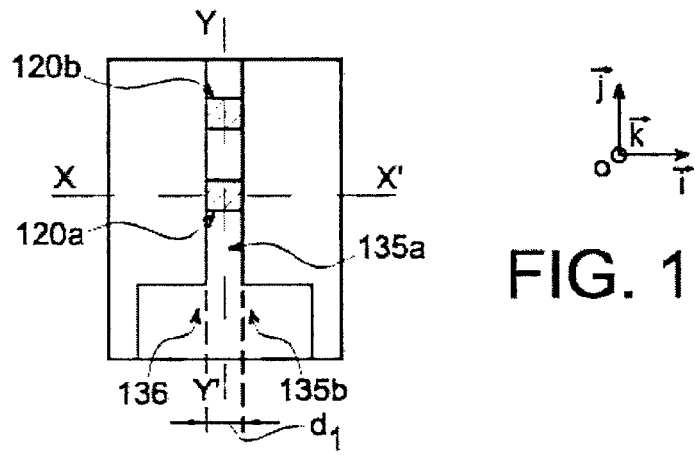
Figure 2D:
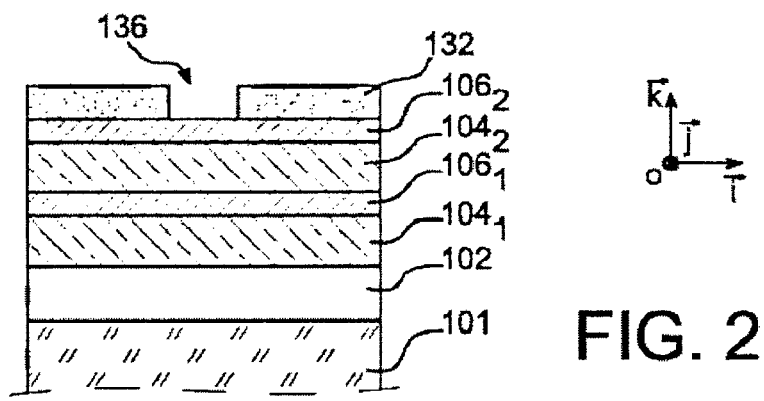
Figure 3D:
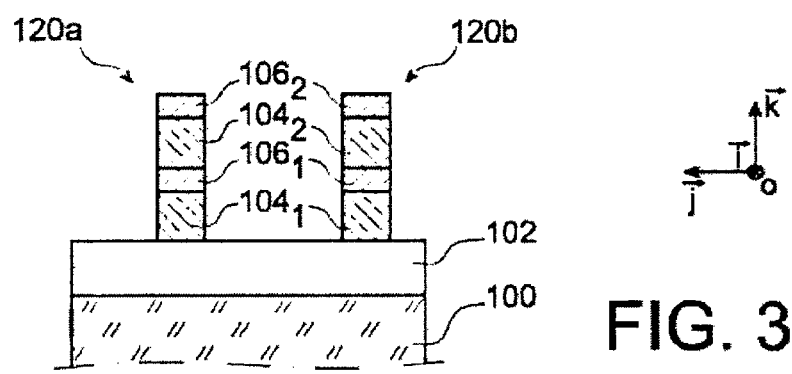

The gate 135a and contact 135b patterns are then reproduced in the first insulating layer 132 in the form of the cavity 136, by anisotropic etching of the insulating layer 132 through the layer of resin 134. Etching of the insulating layer 132 through the layer of resin 134 can be done for example using plasma etching. Etching of the first insulating layer 132 through the layer of resin 134 is done so as to preserve a thickness of the first insulating layer 132 in particular against the sidewalls or lateral surfaces of the blocks 110 and 130, and possibly on these blocks 110 and 130. The cavity 136 produced in the first insulating layer 132 has a gate pattern 135a and gate contact pattern 135b shape, and exposes part of the semiconductor structure 120, as well as the dielectric layer 102 of the substrate. Along the Y'Y axis, between the first semiconductor block 110 and the second semiconductor block 130, the cavity 136 has a uniform critical dimension $d_1$ (measured in a direction parallel to axis X'X). This critical dimension $d_1$ defines the critical dimension of a gate intended to be formed in the cavity 136 (FIGS. 1D, 2D, 3D).

Figure 1E:
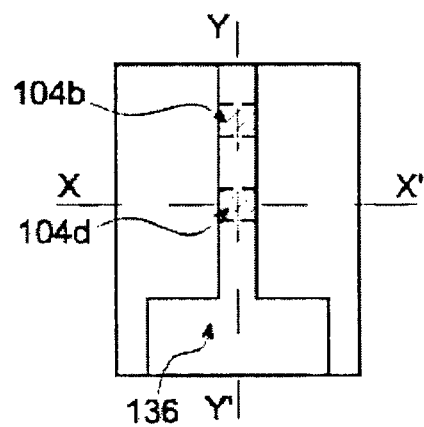
Figure 2E:
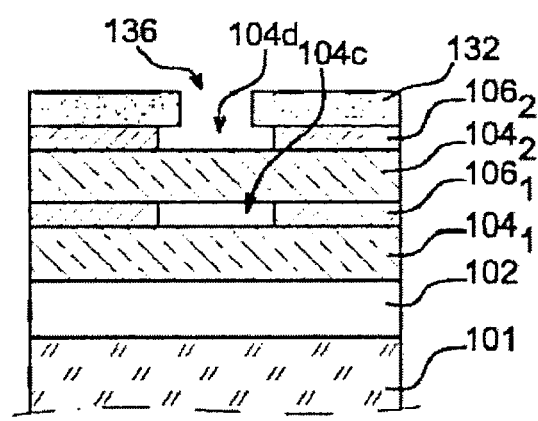
Figure 3E:
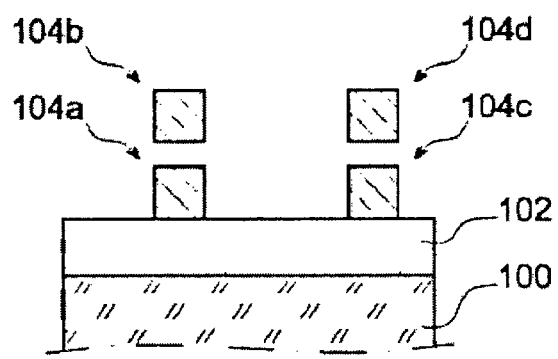

One then removes, in the cavity 136, part of the structure 120, and in particular the parts of the layers $106_1$, $106_2$, located in the cavity 136 and based on the second material, by selective etching with regard to the first material. The layers $104_1$, $104_2$, based on the first material and located in the cavity 136, are preserved, in whole or at least in part, depending on the degree of selectiveness of the etching. The removal of the second material in the cavity 136 can be done with the help of isotropic etching, for example, dry etching using a $CF_4$ plasma or wet etching for example using $HNO_3$:HF: $CH_3COOH$:$H_2O$, or a solution commonly called "Secco" and offered by F. Secco d'Aragona Journal of Electrochem. Soc. 119 (1972) 948. Following removal of the second material in the cavity 136, separated semiconductor bars 104a, 104b, 104c, 104d, based on the first material, and connecting the first block 110 and the second block 130, are formed. The bars 104a and 104c formed from the first semiconductor layer $104_1$ rest in this embodiment on the dielectric layer 102 of the substrate 100, while the bars 104b, 104d, formed in the semiconductor layer $104_2$ of the stack 105, are suspended between the blocks 110 and 130, above the substrate 100, and are not in contact with the latter, or are separated from the latter and in particular from the dielectric layer 102. A first bar 104a and a second bar 104b are aligned in a direction forming a non-null angle, for example 90°, with the primary plane of the support layer 101 or the dielectric layer 102 of the substrate 100. In a direction substantially parallel to the primary plane of the dielectric layer 102 (going through the dielectric layer 102 and parallel to the axes X'X and Y'Y), a third bar 120c, and a fourth bar 120d, are aligned with the first bar 120a and with the second bar 120b, respectively. The semiconductor bars 104a, 104b, 104c, 104d, are intended to serve as branches, a multi-branch transistor channel, or possibly a structure forming several channels (FIGS. 1E, 2E, 3E).

Figure 1F:
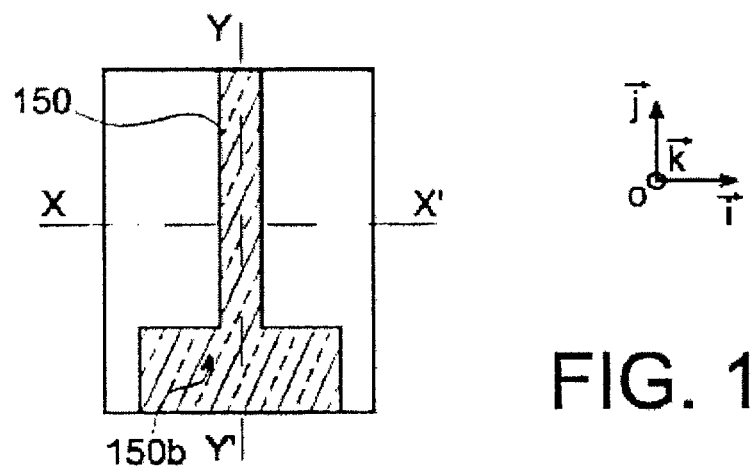
Figure 2F:
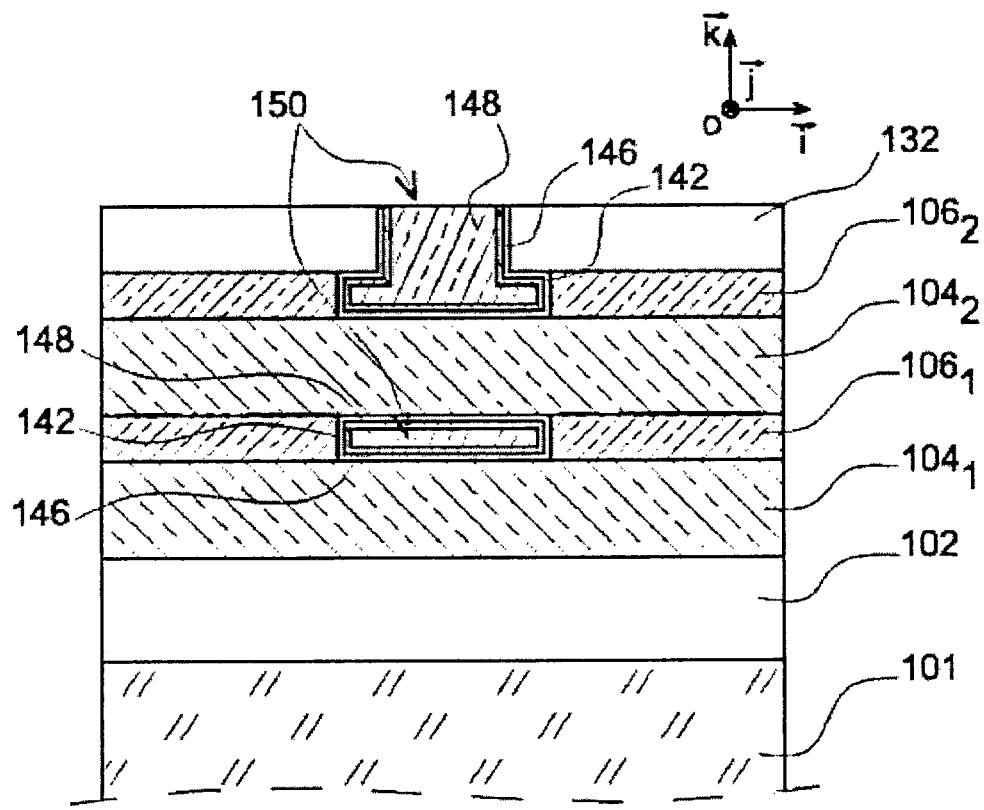
Figure 1G:
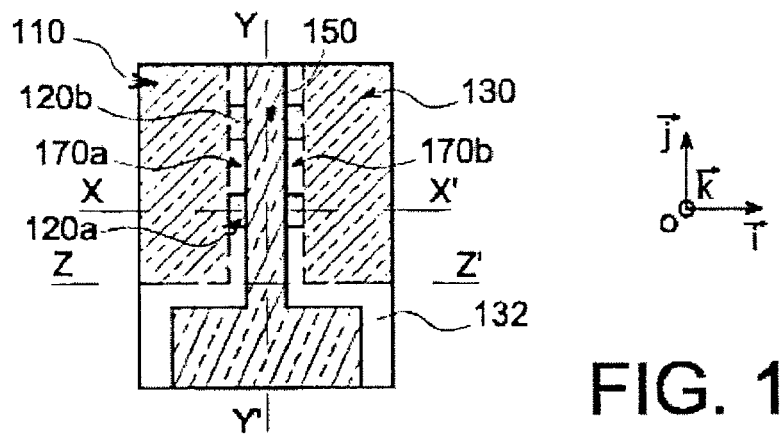
Figure 2G:
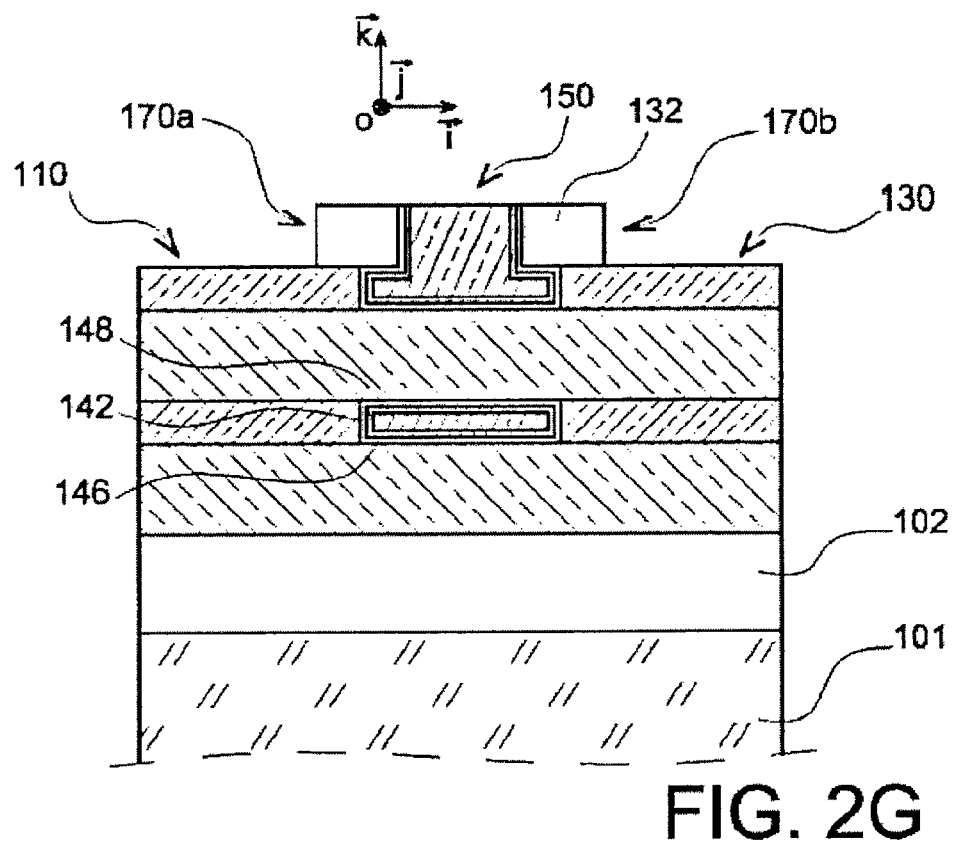
Figure 3F:
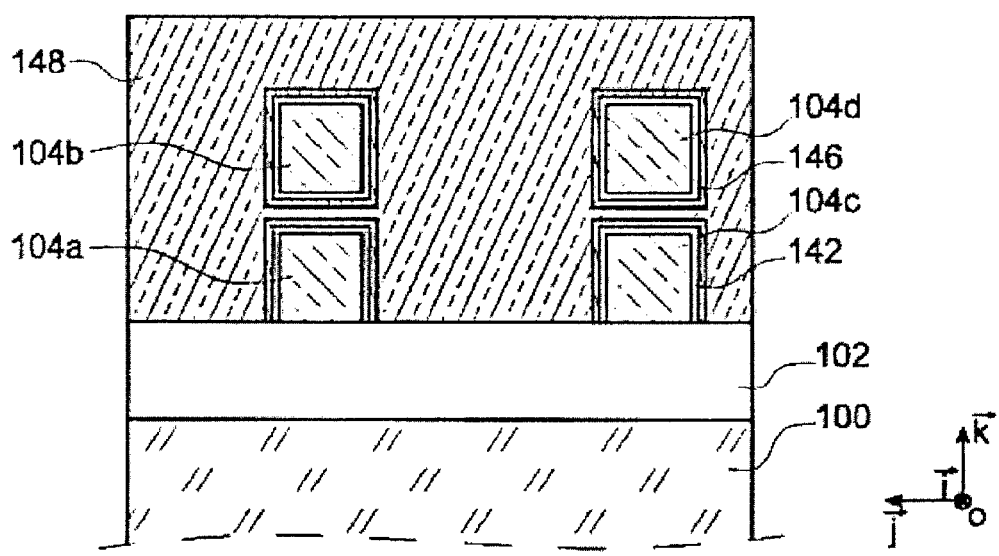
Figure 3G:
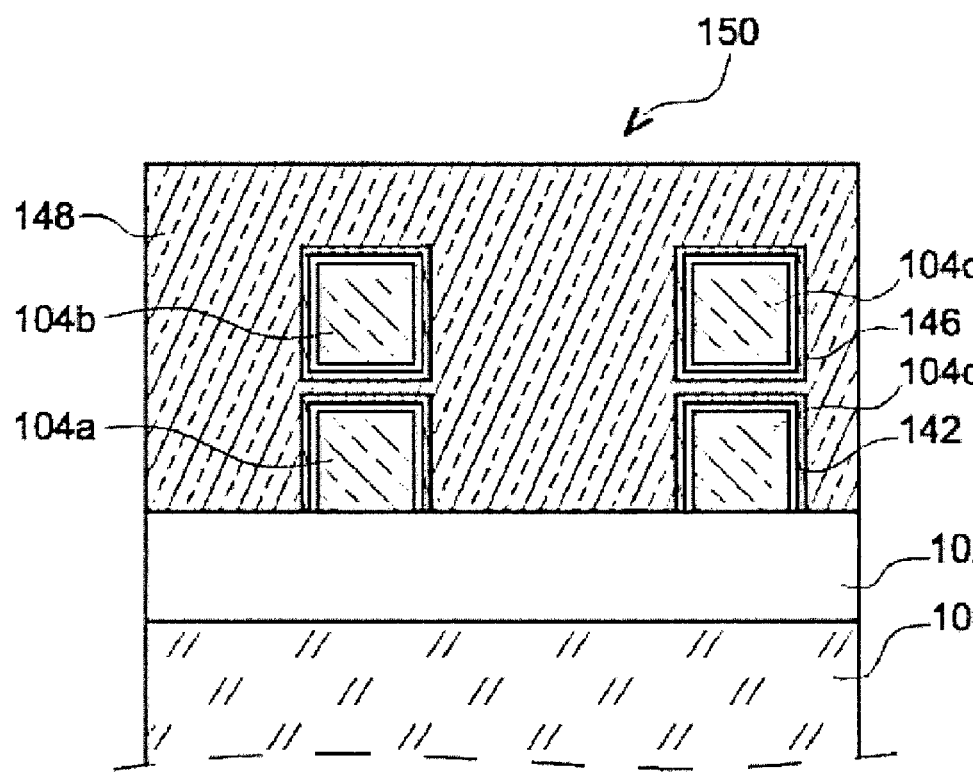
Figure 3G:
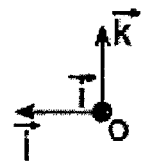

A gate can then be produced in the cavity 136 using a Damascene-type method. To produce this gate, one deposits a dielectric material 142 in the cavity 136, in particular around the exposed parts of the bars 104a, 104b, 104c, 104d. This deposition can be compliant, and based for example on a material of the type commonly called "high-k" such as $HfO_2$, of a thickness between 1 and 10 nanometers, for example. Then, one deposits one or several gate materials. One can for example deposit a metallic gate material 146, for example TiN, or WSi, or TaN, of a thickness for example between 3 and 12 nanometers, so as to cover the gate dielectric 142 around the bars 104a, 104b, 104c, 104d. The cavity 136 can then be filled based on another gate material 148, for example semiconductor such as polysilicon. In the case where filling of the cavity 136 exceeds the mouth of said cavity and covers the first insulating layer 132, a CMP (chemical mechanical polishing) step can be provided to keep the gate 150 material 148 in the cavity 136 only up to the level of the mouth of the latter. Polishing can be done with a stop on the first insulating layer 132. A gate all-around 150, for which the gate dielectric and the gate material are formed all around a respective portion of the semiconductor bars 104b, 104d, or forms a ring around a portion of each of the semiconductor bars 104b, 104d, is thus produced (FIGS. 1F, 2F, 3F). One then completes the formation of spacers 170a, 170b, for the gate 150, from the remaining parts of the first insulating mask layer 132 wherein the cavity 136 was formed. For this, one performs a second partial removal of this insulating layer 132, for example using anisotropic etching which can be done using a plasma. This partial removal can for example be selective dry etching of $Si_3N_4$ with regard to the Si. The second partial removal is done such that the insulating layer 102 is removed above the stack. The remaining zones of the insulating layer 132 which were located on the source and drain region blocks 110 and 130, and on the structure 120 are thus removed. The second partial removal of the insulating layer 132 is also done so as to keep insulating zones against the sidewalls of the blocks 110 and 130 and in contact with the gate 150 (FIGS. 1G, 2G, 3G).

Following this etching, a first insulating zone or a first spacer 170a resulting from the etched insulating layer 132, is in contact with at least one sidewall of the first block 110 located across from the gate, preferably on the entire height of the sidewall (the height of the blocks being defined in a direction parallel to the vector $\vec{k}$ of the orthogonal reference $[O; \vec{i}; \vec{j}; \vec{k}]$. The first spacer 170a is also in contact with the gate 150 and separates and/or isolates, preferably entirely, the latter from the first block 110. A second insulating zone or a second spacer 170b resulting from the etched insulating layer 132, is in contact with at least one sidewall of the second block 130 located across from the gate, preferably on the entire height of this sidewall. The second spacer 170b is also in contact with the gate 150 and separates and/or isolates, preferably entirely, the latter from the second drain block 130. The semiconductor bars 104a, 104b, 104c, 104d go through the first spacer 107a and the second spacer 170b. Part of the insulating mask wherein the gate has been formed, has thus been reduced to form spacers 170a, 170b without an additional dielectric material having been deposited (FIGS. 1G, 2G, 3G).

Once the spacers 170a, 170b are produced, one can complete the formation of a transistor, for example by performing doping of at least one region of the blocks 110 and 130. Then, siliciding of the blocks 110 and 130 and possibly of the gate 150 can advantageously be done. This siliciding can include a step for depositing a metal such as nickel, for example, a step for siliciding annealing, then selective removal of the unconsumed metal.

Figure 15A:
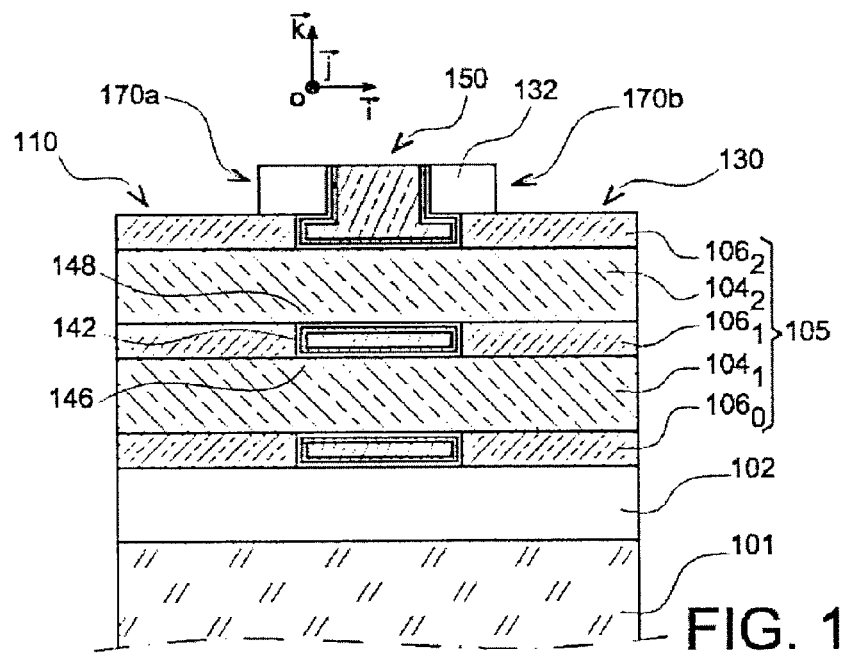
FIGS. 15A to 15B illustrate a variation of the first example method.
Figure 15B:
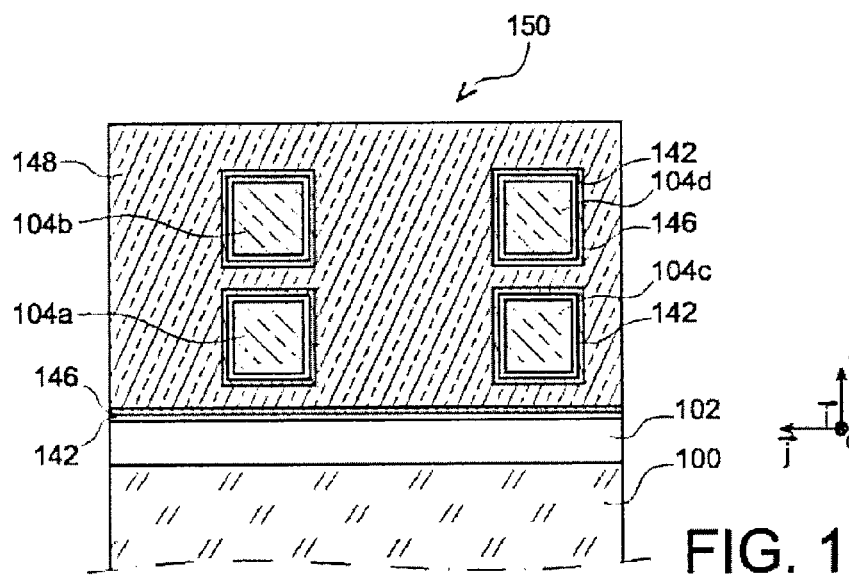

According to one variation of the method embodiment previously described, another stack 1005 can be made. This other stack 1005 can also be made up of an alternation of "sacrificial" layers, $106_0$, $106_1$, $106_2$, based on said second material, and semiconductor layers $104_1$, $104_2$ based on said first material, but arranged differently in relation to the stack 105 previously described. In this other stack 1005, the dielectric layer 102 of the substrate 100 is this time covered by, and in contact with, a sacrificial layer $106_0$ based on the second material, itself covered by a layer $104_1$ based on the first material, itself covered by an alternation of layers based on the second material and layers based on the first material. Once this other stack 1005 is produced one can carry out the same method steps as those described previously in connection with FIGS. 1, 2, 3. One can, with this variation of the method, obtain semiconductor bars 104a, 104b, 104c, 104d, separated from the dielectric layer 102 of the substrate 100 and a gate 151, completely surrounding, for which the gate dielectric and the gate material are formed all around a respective portion of the semiconductor bars 104a, 104b, 104c, 104d, or forms a ring around a portion of each of the semiconductor bars 104a, 104b, 104c, 104d (FIGS. 15A, 15B).

Figure 16A:
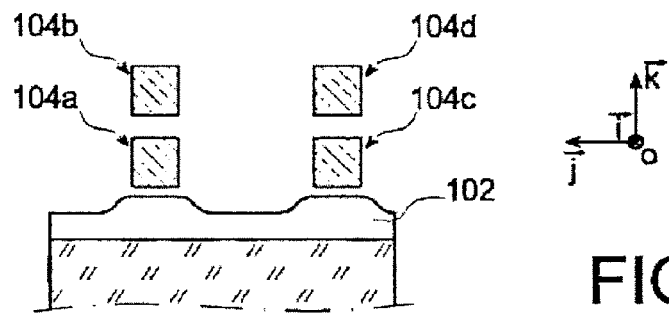
FIGS. 16A to 16B illustrate another variation of the first example method.
Figure 16B:
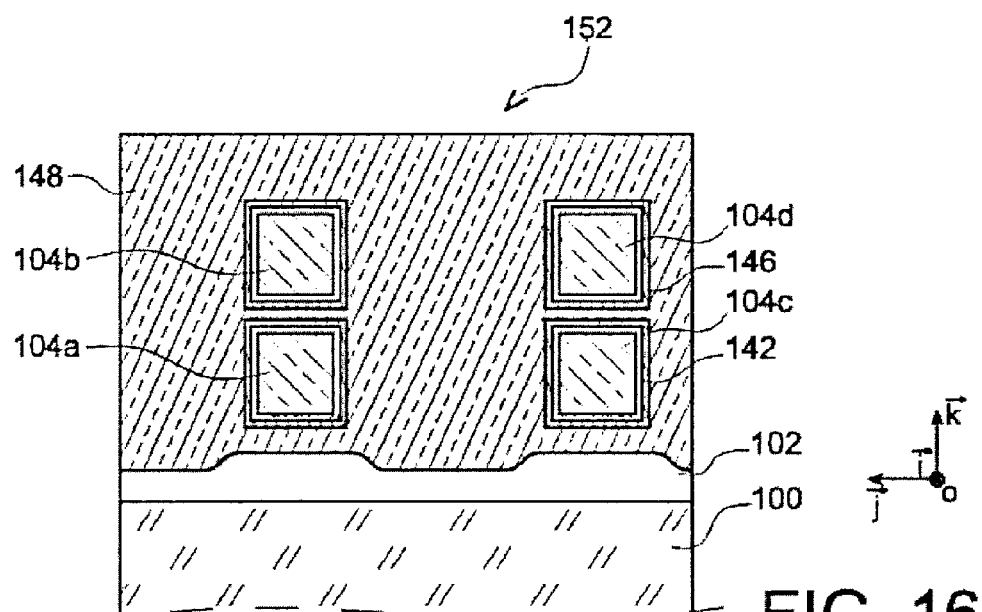

According to another variation of the method embodiment previously described in connection with FIGS. 1, 2, 3, after, for example, removal of the second material in the cavity 136 (which was described in connection with FIGS. 1E, 2E, 3E), to form the separated semiconductor bars 104a, 104b, 104c, 104d, based on the first material, one can remove a thickness of the dielectric layer 102 of the substrate 100. This removal can be done by isotropic etching of the dielectric material of the layer 102, for example through wet etching using HF, so as to separate the bars 104a, 104c from the substrate 100 dielectric layer 102, and form a space between the bars 104a, 104c and this dielectric layer 102. The bars 104a, 104b, 104c, 104d, thus formed are all suspended above the substrate 100 and are not in contact with the latter (FIG. 16A). One can then carry out the same method steps as those previously described in connection with FIGS. 1F-1G, 2F-2G, 3F-3G, for forming a gate, then forming spacers 170a, 170b. One can, with this variation, obtain a gate all-around 152, for which the gate dielectric and the gate material are formed all around a respective portion of the semiconductor bars 104a, 104b, 104c, 104d, or forms a ring around a portion of each of the semiconductor bars 104a, 104b, 104c, 104d, is thus produced (FIG. 16B).

According to one variation (not shown) of the method examples just described, a buffer or protective layer for the stack 105 can be deposited on said stack before forming the first block 110, the second block 130 and the structure 120.

This "buffer" layer can be based on $SiO_2$, and of a thickness for example between 5 and 50 nanometers, and is then covered by the first insulating layer 132, for example based on $Si_3N_4$.

Figure 4A:
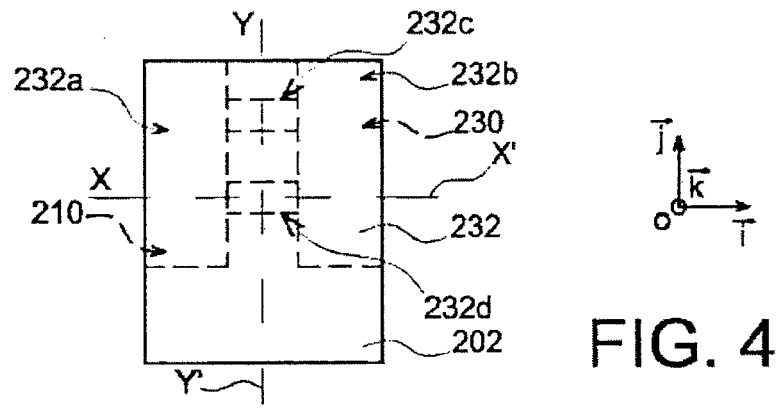
Figure 5A:
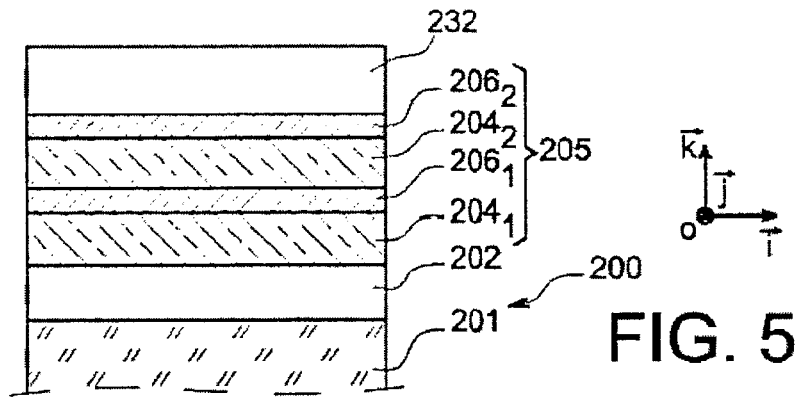
Figure 4B:
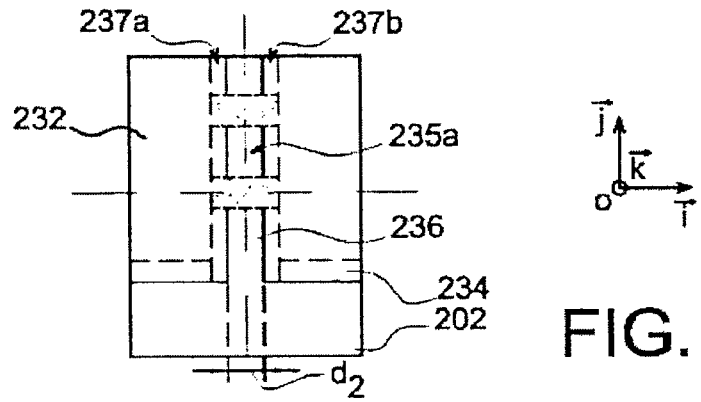
Figure 5B:
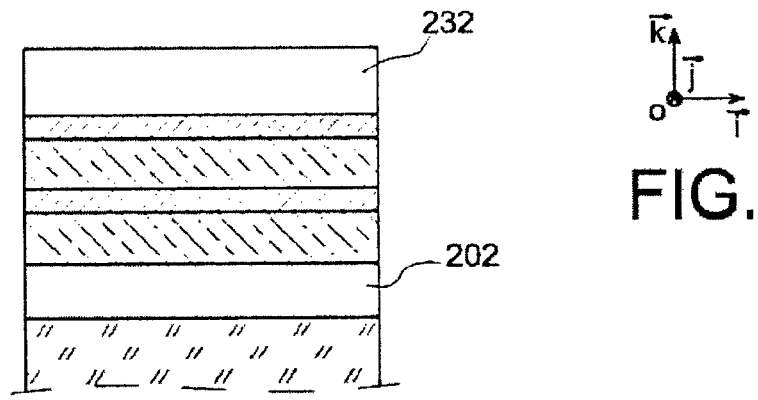
Figure 4C:
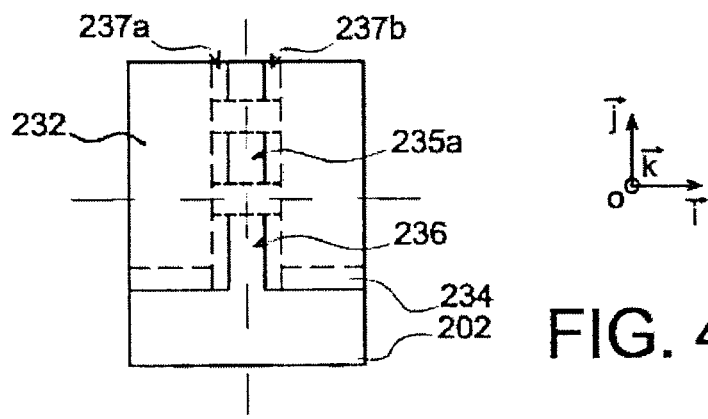
Figure 5C:
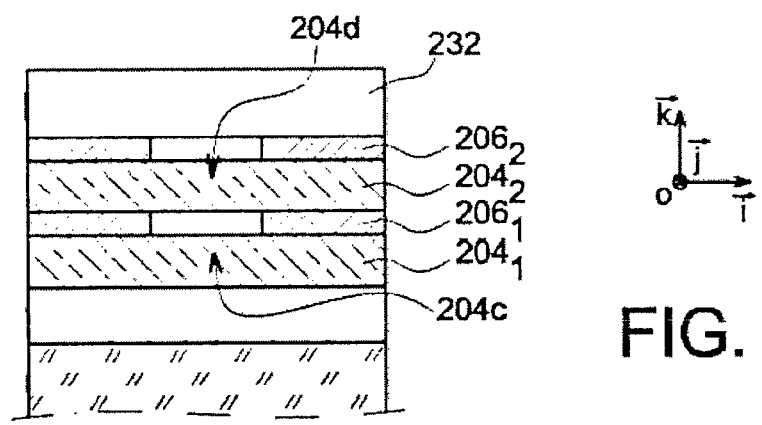

Another example of the microelectronic method will now be provided in connection with FIGS. 4A-4G; 5A-5G; 6A-6G (FIGS. A-4G show a top view of a microelectronic device during production, while FIGS. 5A-5C show, respectively, cross-sectional views of the microelectronic device during production along a cutting plane going through an axis X'X and parallel to a plane [O; $\vec{i}$; $\vec{k}$] of an orthogonal reference [O; $\vec{i}$; $\vec{j}$; $\vec{k}$], and FIGS. 6A-6G show other cross-sectional views of the microelectronic device during production along another cutting plane going through an axis Y'Y and parallel to a plane [O; $\vec{j}$; $\vec{k}$] of an orthogonal reference [O; $\vec{i}$; $\vec{j}$; $\vec{k}$]).

Figure 6A:
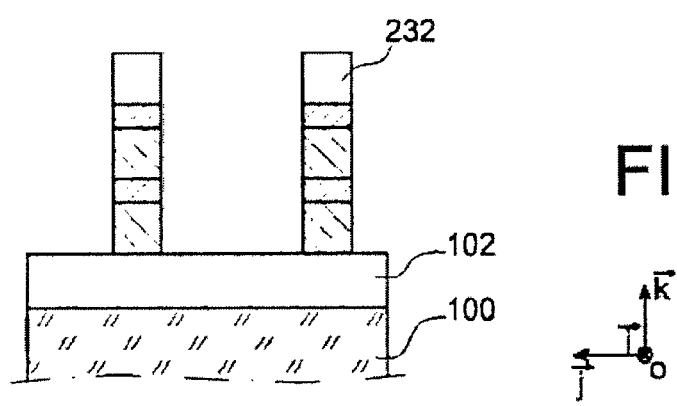

For this variation, one produces on a substrate 200, for example of the semiconductor on insulator type, a stack 205 of layers $204_1$, $206_1$, $204_2$, $206_2$, comprising an alternation of layers $204_1$, $204_2$, based on a first semiconductor material, for example Si, and layers $206_1$, $206_2$, based on a second material different from the first material and able to be selectively etched in relation to the first material. The second material can for example be a semiconductor material such as SiGe. The stack 205 can for example be made by performing several successive epitaxies. One then deposits at least one first insulating layer 232, for example based on $Si_3N_4$, above the stack 205. One then produces a mask (not shown), for example using a photolithography method, or for example using an electron beam ("e-beam") or using a hybrid process in which one uses an e-beam and a deep UV ray or a method for molding nanometric patterns ("nano-imprinting") on the first insulating layer 232. One then etches the insulating layer 232 through the mask, so as to form, in the first insulating layer 232, at least one first transistor source region pattern 232a, at least one second transistor drain region pattern 232b, as well as one or several patterns connecting the first pattern 232a and the second pattern 232b, for example a third pattern 232c and a fourth pattern 232d, connecting the first pattern 232a and the second pattern 232b, in the form of two parallel and separated strips. One then etches the stack 205 through the mask and the insulating layer 232, for example through anisotropic etching using a plasma so as to form, under the first pattern 232a, at least one first block 210 designed to serve as the at least one transistor source region, and under the second pattern 232b, at least one second block 230 designed to serve as the at least one transistor drain region, as well as under the third and fourth patterns 232c, 232d respectively, a first stack 220a of bars and a second stack 220b of bars, connecting the first block 210 and the second block 230. In the stacks 220a and 220b of bars, the branches of a transistor channel are intended to be formed. On the etched stack 205 thus produced, the blocks 210 and 230 as well as the stacks of bars 220a and 220b, are covered by the insulating layer 232. The mask is then removed (FIGS. 4A, 5A, 6A).

One then forms insulating zones against the sidewalls or lateral surfaces of the first block 210 and the second block 230.

To do this, one can deposit a layer of dielectric material 234 capable of reacting to exposure to an e-beam or sensitive to the action of an e-beam, for example an HSQ (hydrogen silsesquioxane) material on and around the etched stack 205. One then performs a partial removal of the layer of dielectric material 234, so as to preserve an insulating thickness against the lateral surfaces or sidewalls of the blocks 210 and 230.

Figure 6B:
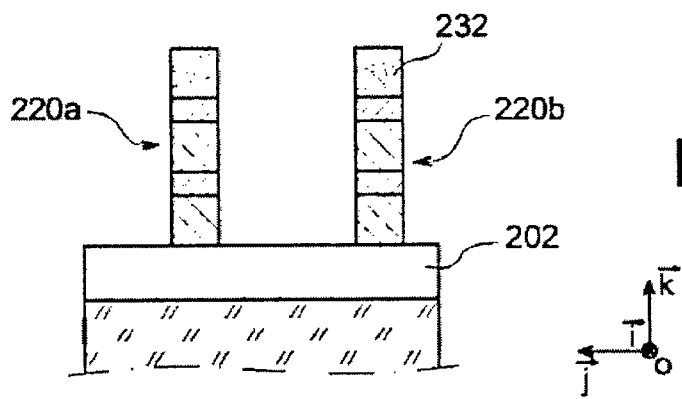

The lithography is done using an e-beam. The parts of the layer 234 of dielectric material which are not exposed to the e-beam are chemically removed, for example using diluted TMAH (tetra methyl ammonium hydroxide). The dielectric material 234 is in particular partially removed in a region located between the source 210 and drain 230 blocks, so as to form, in this region, a cavity 236 whereof the walls are based on a dielectric material 234, and whereof the shape is that of a transistor gate pattern 235a. The zones of the dielectric material 234 which have been exposed to the e-beam are at least partially transformed into zones based on a dielectric material of a different nature than that of the material 234, for example $SiO_2$. The preserved zones of the layer of dielectric material 234 form insulating spacers 237a and 237b, located against the sidewalls of the blocks 210 and 230. In a zone located between the blocks 210 and 230, the distance $d_2$ separating the spacers 237a and 237b or the width $d_2$ of the cavity 236 is uniform ($d_2$ being measured in a direction parallel to the axis X'X indicated in FIG. 4B). This distance or width $d_2$ can for example be between 5 and 50 nanometers, and corresponds to the critical dimension of a gate designed to be formed in the cavity 236, between the blocks 210 and 230 (FIGS. 4B, 5B, 6B).

Figure 6C:
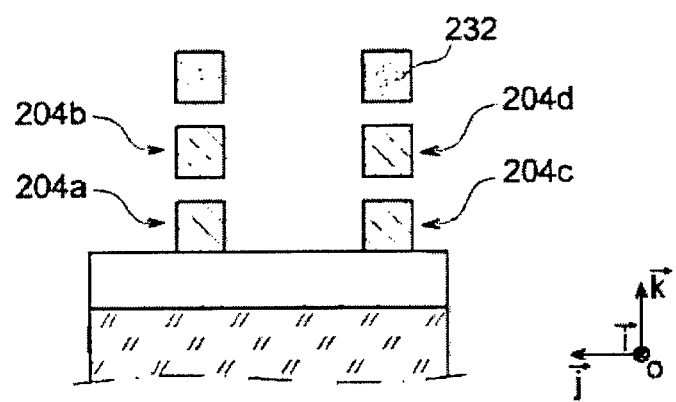

One then removes part of the structure 220 exposed by the cavity 236, and in particular parts of the layers $206_1$, $206_2$, based on the second material located in the cavity 236. This removal is done using etching of the second material, selective with regard to the first material, for example isotropic etching, so as to form separate and/or separated semiconductor bars 204a, 204b, 204c, 204d, based on the first material. The etching of the second material can be dry etching done for example using $CF_4$ or wet etching done for example using $HNO_3$:$HF$:$CH_3COOH$:$H_2O$, or a solution commonly called "Secco" (FIGS. 4C, 5C, 6C).

Figure 4D:
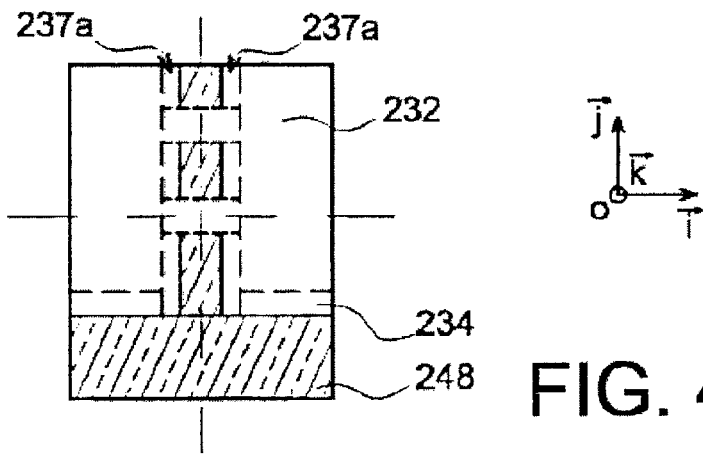
Figure 5D:
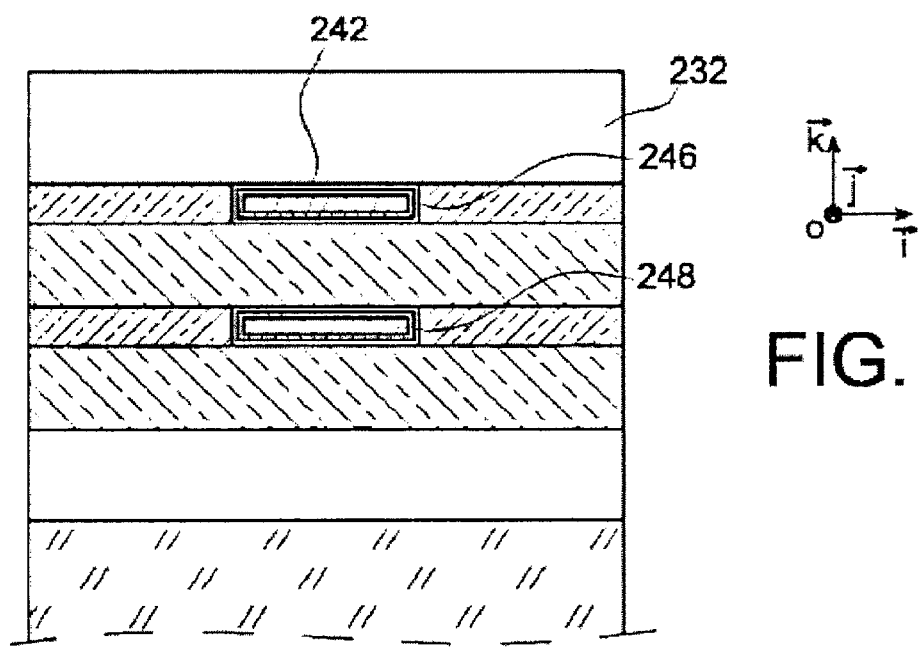
Figure 6D:
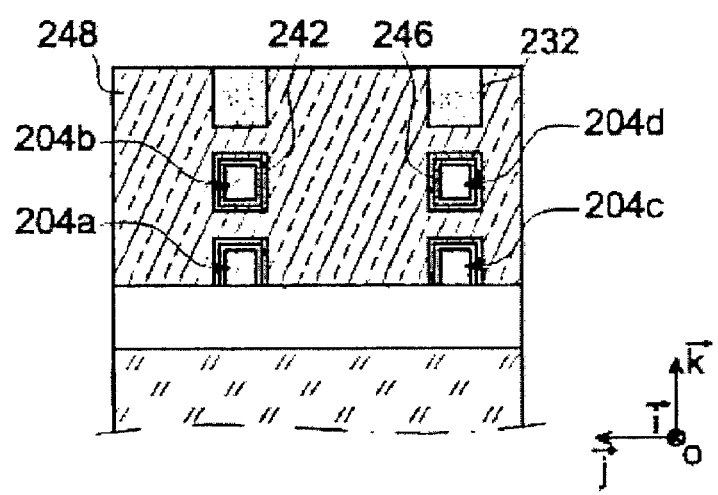
Figure 6F:
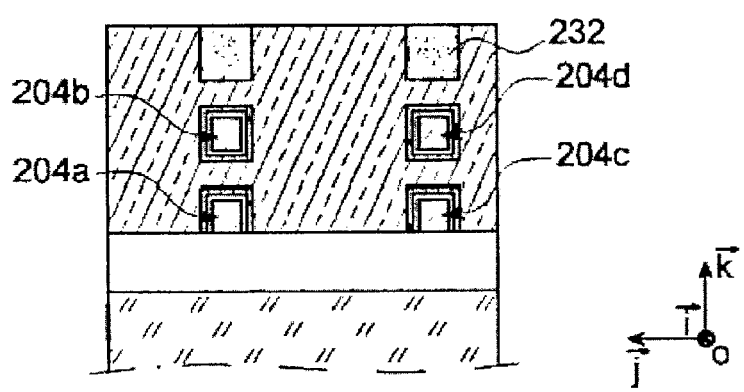

A gate 250 is then made in the cavity 236 using a Damascene-type method, during which one first deposits a gate dielectric material 242 around the bars 204a, 204b, 204c, 204d exposed by the cavity 236, then, depositing at least one first gate material 246, for example metallic such as TiN or TaN or WSi, so as to form a thickness, for example between 3 and 12 nanometers, covering the gate dielectric layer 242 around the bars 204a, 204b, 204c, 204d. Then, the cavity 236 is filled based on a second gate material 248, which can be semiconductor, such as polysilicon, for example. Filling may be followed by a CMP polishing step, with a stop on the first insulating layer 232 (FIGS. 4D, 5D, 6D).

Figure 4E:
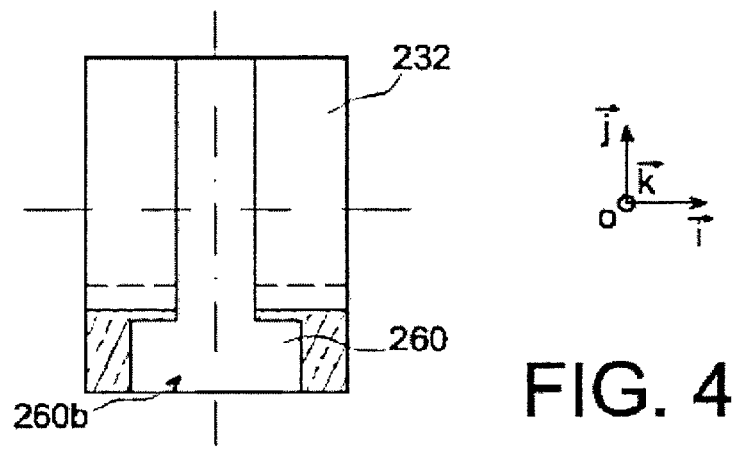
Figure 5E:
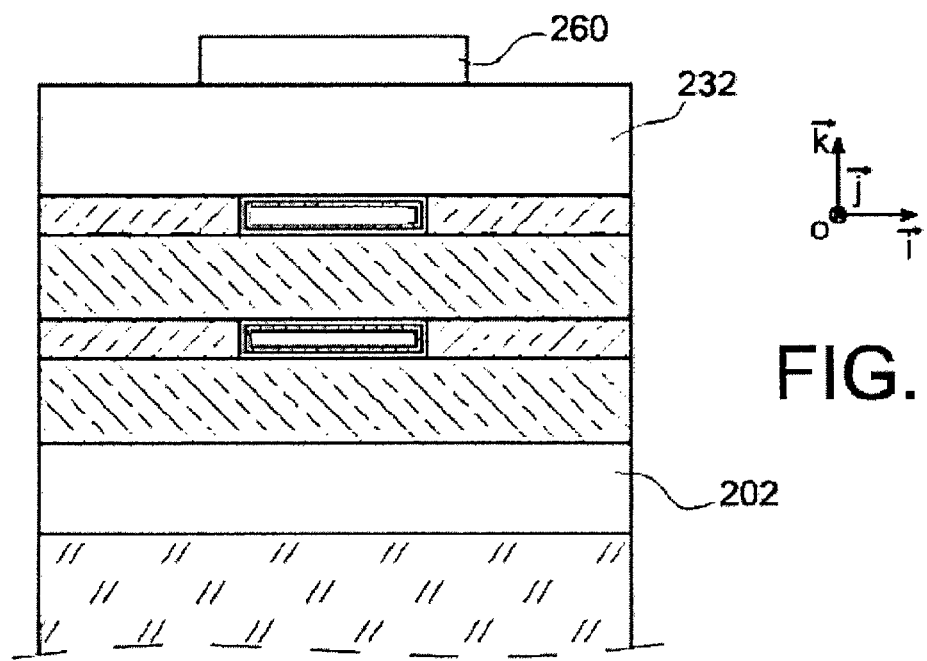
Figure 5F:
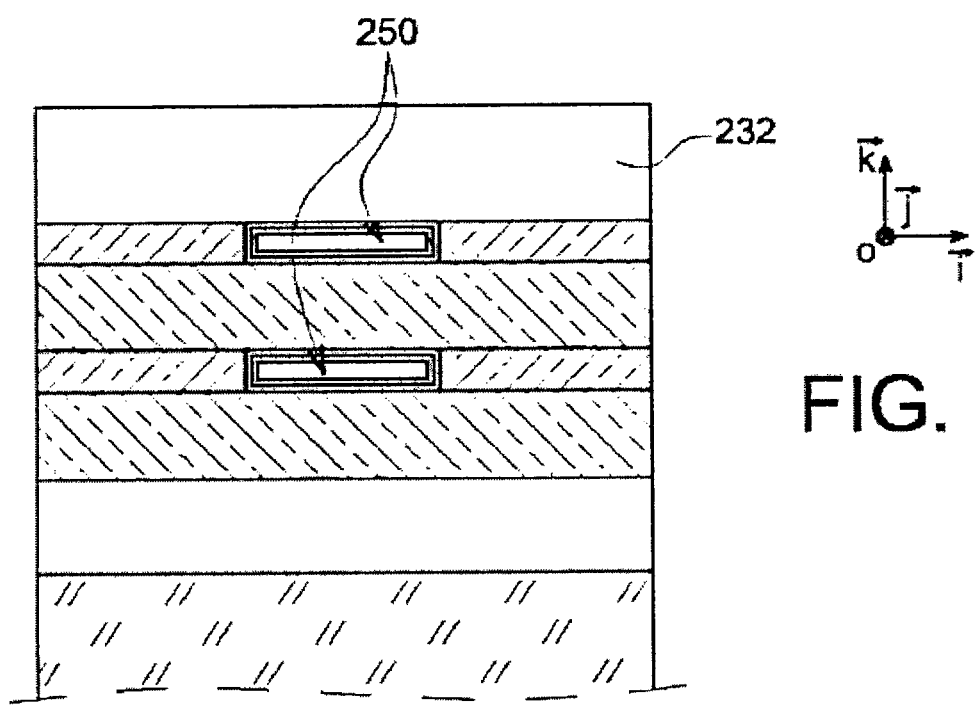

One then produces a mask 260, which can be based on a polymer or a photosensitive resin, or a hard mask made by photoetching. The mask 260 is formed so as to cover and protect the zones based on the gate material 246, 248 located between the first semiconductor block 210 and the second semiconductor block 230. The mask 260 also comprises a gate contact pattern 260b. The mask 260 can be made for example by depositing a layer of resin, then insulation, by direct writing or through a mask (FIGS. 4E, 5E, 6E).

Selective and, for example anisotropic, etching of the gate materials 246, 248 with regard to the gate dielectric 242, so as to reproduce the pattern 260a, is then done. This etching can be anisotropic and done for example using a plasma. One then removes the mask 260.

Figure 4F:
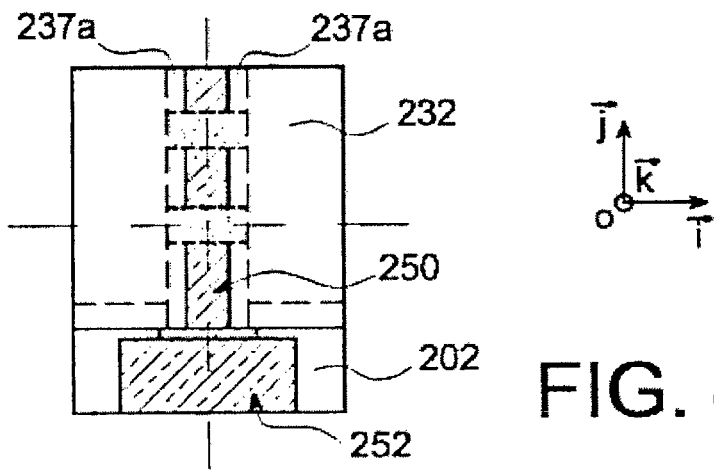
Figure 4G:
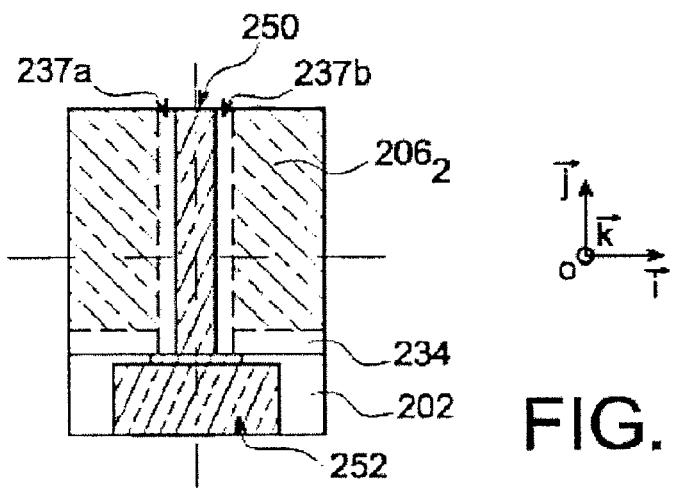
Figure 5G:
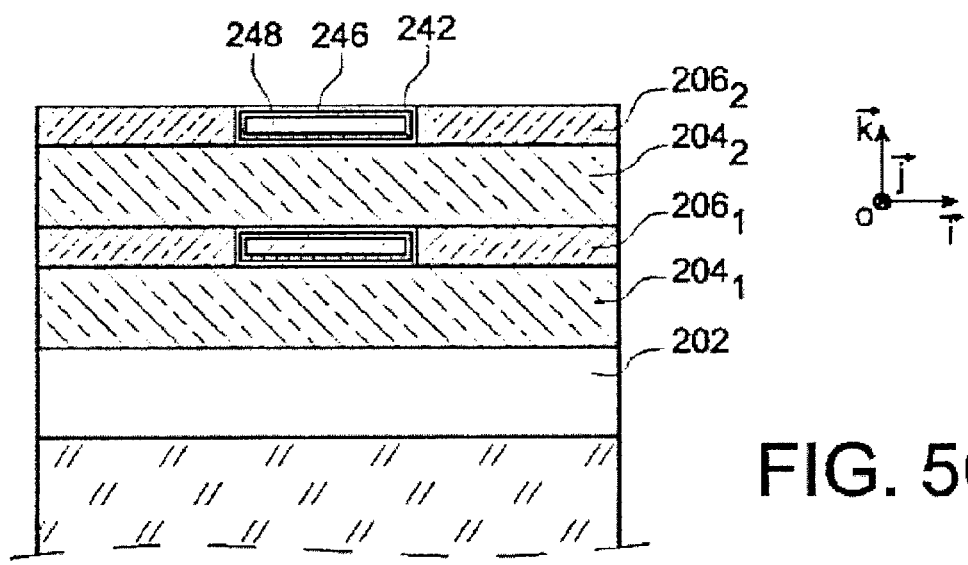
Figure 6G:
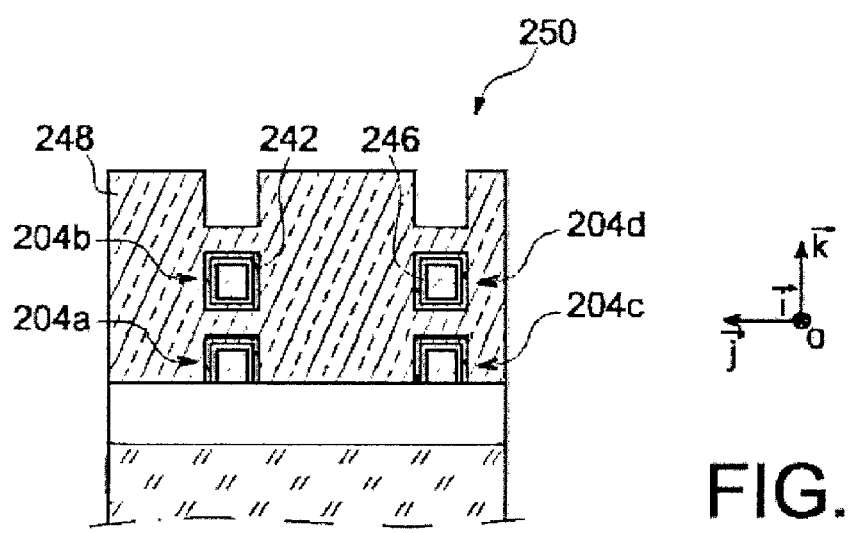

One then performs a partial removal of the first insulating layer 232, so as to remove this layer 232 on the blocks 210 and 230 as well as above the blocks 220a and 220b. This removal can be done through anisotropic etching, for example using $H_3PO_4$ (FIGS. 4G, 5G, 6G).

Figure 13:
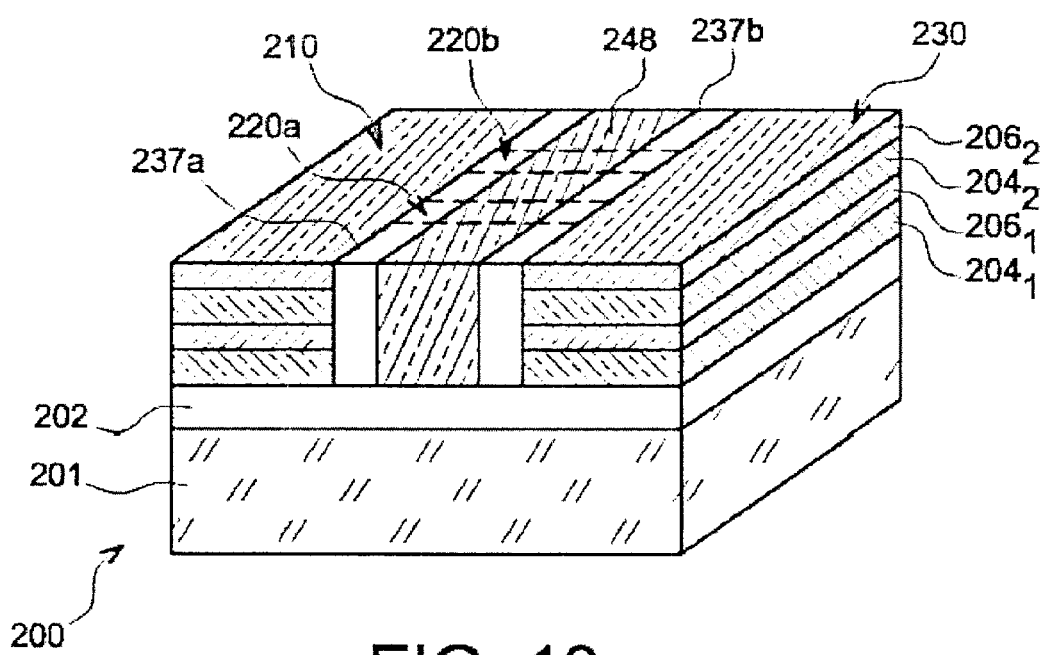
FIG. 13 illustrates an example of a microelectronic device according to the invention.

A microelectronic device comprising, on a substrate, a first block 210 in which a transistor source region is designed to be made, a second block 230 wherein a transistor drain region is designed to be made, several separated bars, connecting the first block 210 and the second block 230, including one or several bars 204c, 204d, which are not in contact with the substrate, a gate 250 at least partially surrounding the bars 204a, 240b, 204c, 204d, and insulating zones 237a, 237b, or spacers resting on the dielectric layer 202 of the substrate 200 and formed on the sidewalls or lateral surfaces of the blocks 210 and 230, is thus done. The gate 250 has a uniform critical dimension $d_2$ between the blocks 210 and 230. The insulating spacers 237a and 237b are in contact with the gate 250 and totally separate said gate from the source and drain region blocks. The bars 204a, 204b, 204c, 204d, connecting the first block 210 and the second block 230, go through the spacers 237a, 237b and the gate 250. A microelectronic device of this type is illustrated according to a perspective view in FIG. 13.

Once the spacers 237a, 237b are made, one can complete the formation of a transistor, for example by performing a doping of the blocks 210 and 230. Siliciding of the blocks 210 and 230 and of the gate 250 can then be done. This siliciding can comprise a step for depositing a metal such as nickel, for example, a step for siliciding annealing, then selective removal of the unconsumed metal.

Figure 14A:
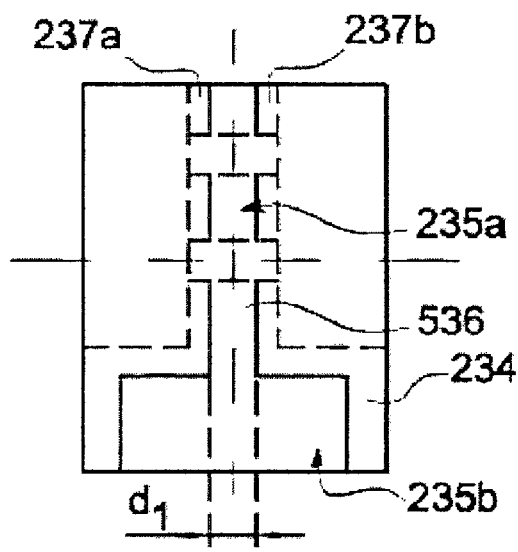
FIGS. 14A and 14B illustrate a variation of the second example of the method.
Figure 14B:
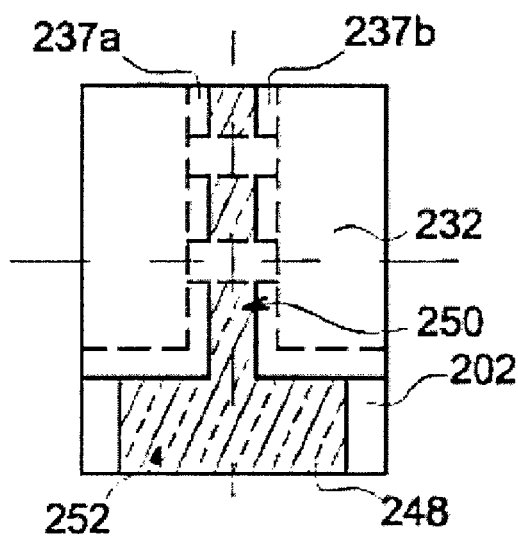

According to one variation of the method example just described, after having deposited the layer of dielectric material 234 able to react to the e-beams, for example of the HSQ type on and around the etched stack 205, one then performs a partial removal of the dielectric material 234, so as to form, in a region located between the source 210 and drain 230 blocks, a cavity 536 whereof the walls are based on a dielectric material 234, and whereof the shape is that of a transistor gate pattern 235a and a gate contact pattern 235b in the extension of the gate pattern 235a (FIG. 1A). Then, as for the preceding example, one forms the separate and/or separated bars 204a, 204b, 204c, 204d. One then forms a gate 250 and a gate contact 252 in the cavity 236 by depositing, in this cavity, at least one gate dielectric and at least one gate material (FIG. 14B).

Figure 7A:
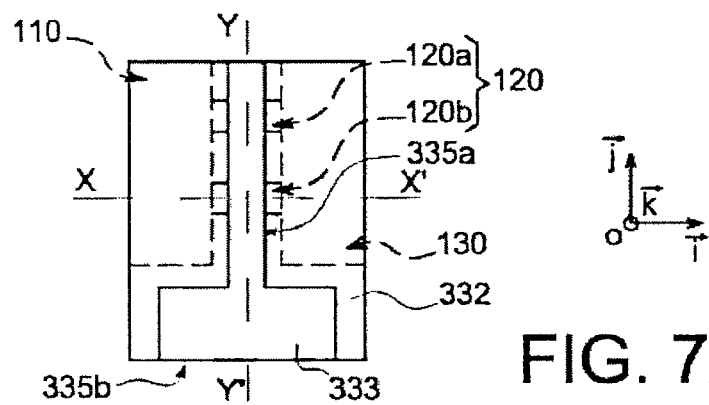
FIGS. 7A to 7G, 8A to 8G, 9A to 9G, illustrate a third example of a microelectronic method according to the invention, comprising the production of at least one transistor gate on a multi-branch transistor channel structure, and insulating spacers for this gate.
Figure 8A:
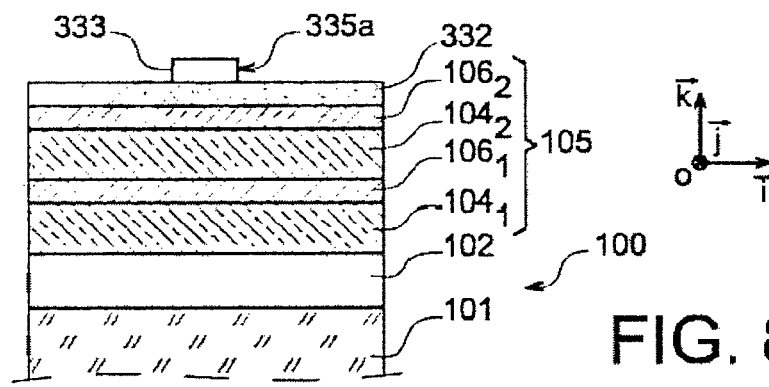
Figure 9A:
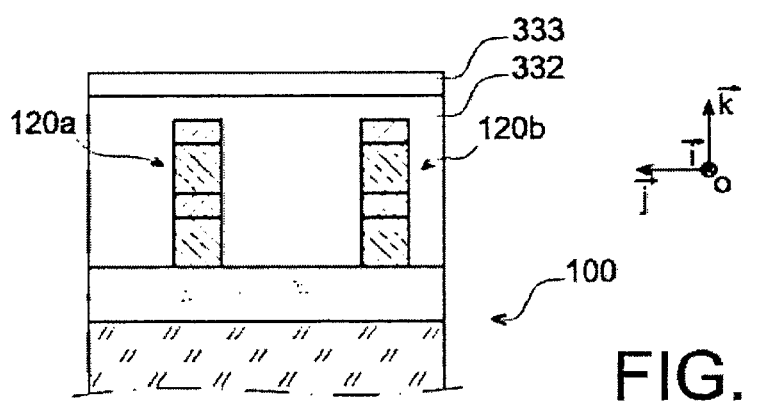

Another variation of the microelectronic method example described in connection with FIGS. 1, 2 and 3 will now be given in connection with FIGS. 7A-7G; 8A-8G; 9A-9G; (FIGS. 7A-7G showing top views of the microelectronic device during production, while FIGS. 8A-8G show cross-sectional views of the microelectronic device during production along a cutting plane going through an axis X'X and parallel to a plane [O; $\vec{i}$; $\vec{k}$] of an orthogonal reference [O; $\vec{i}$; $\vec{j}$; $\vec{k}$], and FIGS. 9A-9G show other cross-sectional views of the microelectronic device during production along another cutting plane going through an axis Y'Y and parallel to a plane [O; $\vec{j}$; $\vec{k}$] of an orthogonal reference [O; $\vec{i}$; $\vec{j}$; $\vec{k}$]. As for the method example given in connection with FIGS. 1, 2 and 3, one first forms the stack 105 of thin layers $104_1$, $106_1$, $104_2$, $106_2$, on the substrate 100, then one etches this stack 105, so as to form the first source region block 110, the second drain region block 130 and the structure 120, made up of two other separated blocks connecting the first block 110 and the second block 130. One then deposits a first insulating layer 332, based on a first dielectric material, for example based on $Si_3N_4$, on and around the etched stack 105. According to this variation, one then forms at least one gate pattern 335a and possibly a gate contact pattern 335b in a mask layer 333, deposited on the first insulating layer 332. The patterns 335a and 335b can for example be formed by photolithography. In this case, the mask layer 333 can for example be a layer of photosensitive resin (FIGS. 7A, 8A, 9A).

Figure 7B:
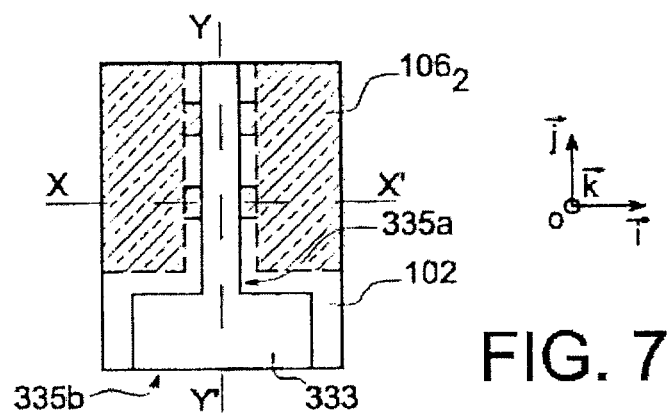
Figure 8B:
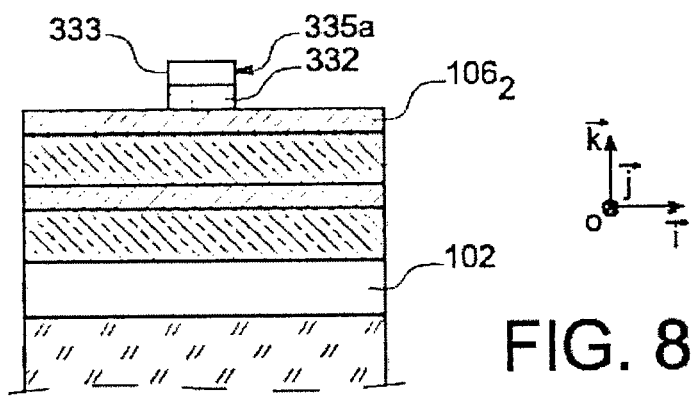
Figure 9B:
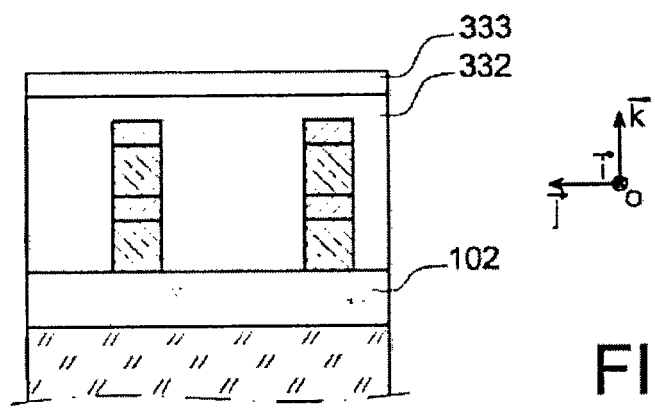

One then etches the first insulating layer 332 through patterns 335a and 335b of the mask layer 333, so as to reproduce these patterns in the first insulating layer 332. The first insulating layer 332 is preferably preserved only under the patterns 335a and 335b. This etching can for example be done using plasma etching (FIGS. 7B, 8B, 9B).

Figure 7C:
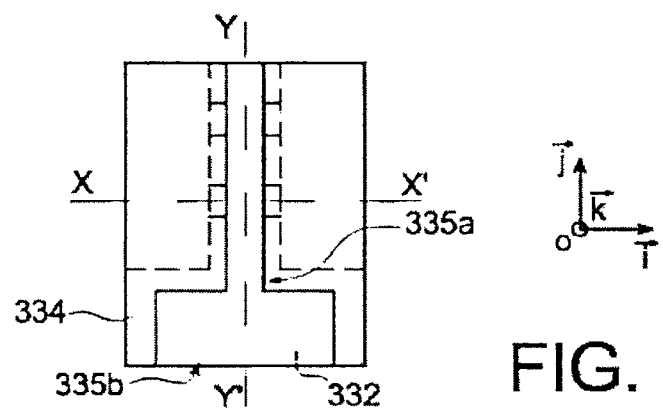
Figure 8C:
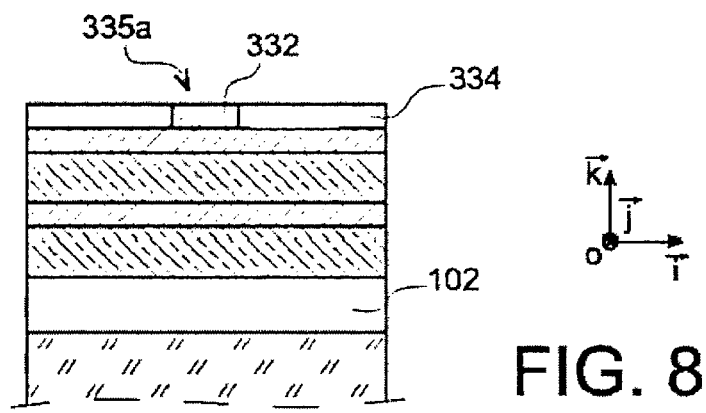
Figure 9C:
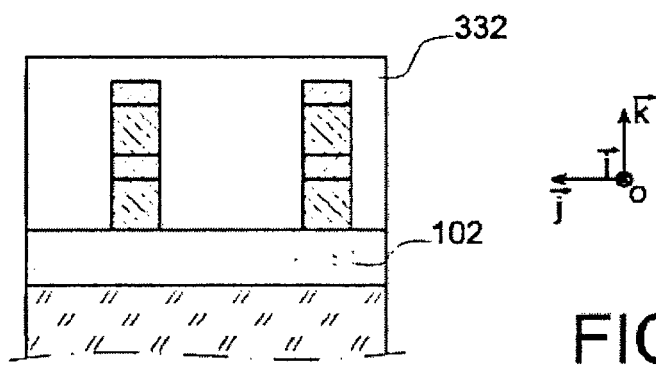

One then removes the layer of resin 333, for example using the following chain $H_2SO_4+H_2O_2$ then $H_2O_2+NH_4OH+H_2O$, then by plasma $O_2+H_2+N_2$. One then deposits a second insulating layer 334 based on a second dielectric material, for example based on a dielectric of the HTO (High Thermal Oxide) type, on and around the gate 335a and gate contact 335b patterns made in the first insulating layer 332. One then removes parts of the second insulating layer 334 located above the patterns 335a and 335b made in the first insulating layer 332. This removal can be done by CMP polishing, and so as to expose the patterns 335a and 335b (FIGS. 7C, 8C, 9C).

Figure 7D:
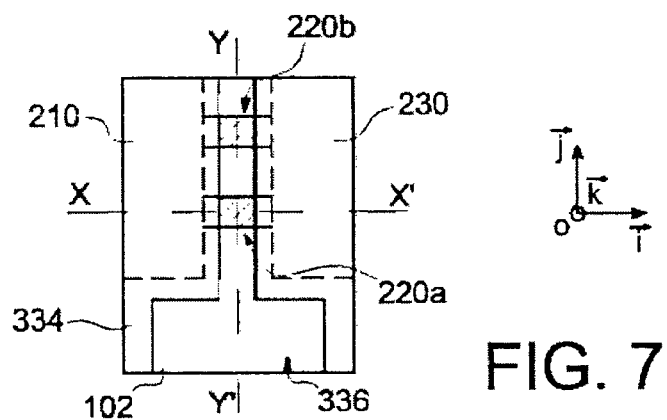
Figure 8D:
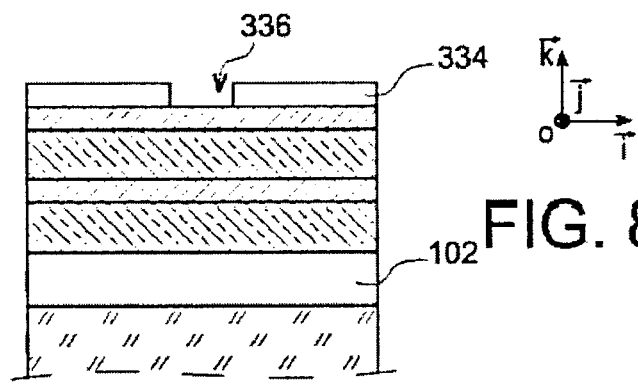
Figure 9D:
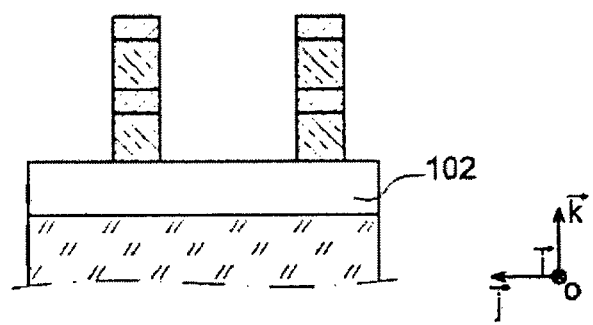

One then removes the first insulating layer 332 and in particular patterns 335a and 335b. This removal can be done through selective etching, for example through wet etching based on $H_3PO_4$, so as to form a cavity 336 in the second insulating layer 334 having the shape of gate 335a and gate contact 335b patterns, the cavity 336 exposing the dielectric layer 102 of the substrate 100 and part of the stacks 120a and 120b of the structure 120 connecting the semiconductor blocks 110 and 130 (FIGS. 7D, 8D, 9D).

Figure 7E:
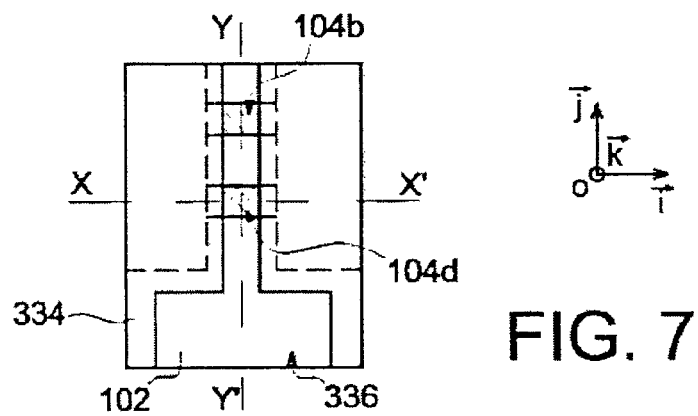
Figure 8E:
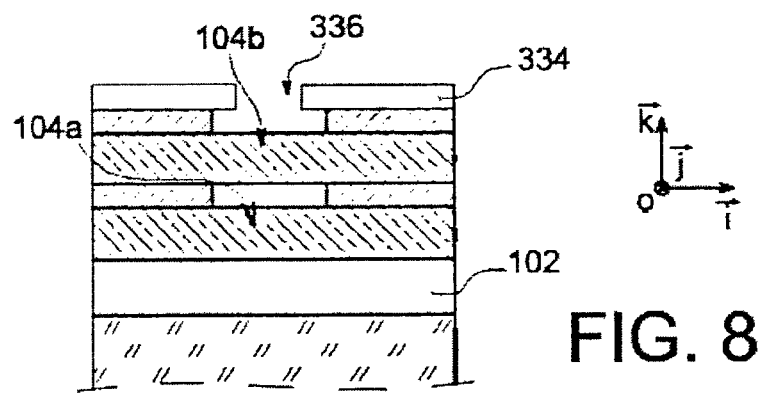
Figure 9E:
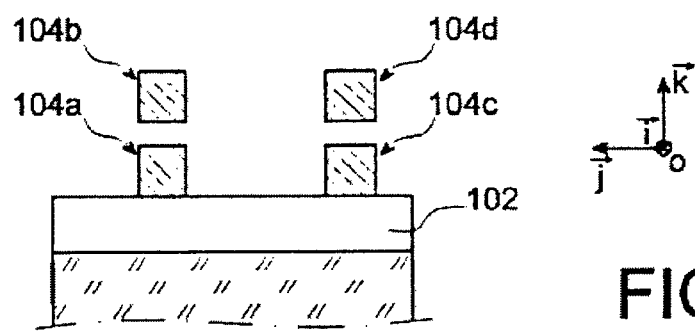

One then removes parts of the layers $106_1$, $106_2$ from the stack 105 which are based on the second material and located in the cavity 336. This removal can for example be done using dry etching using a $CF_4$-based plasma or through wet etching using $HNO_3$:$HF$:$CH_3COOH$:$H_2O$ or a solution called "Secco". Following the removal of the second material in the cavity 336, separated semiconductor bars 104a, 104b, 104c, 104d, based on the first material and connecting the first block 110 and the second block 130 are formed. Some bars 104b, 104d, are suspended between the first block 110 and the second block 130 and located above the substrate 100, without being in contact with the dielectric layer 102 (FIGS. 7E, 8E, 9E).

Figure 7F:
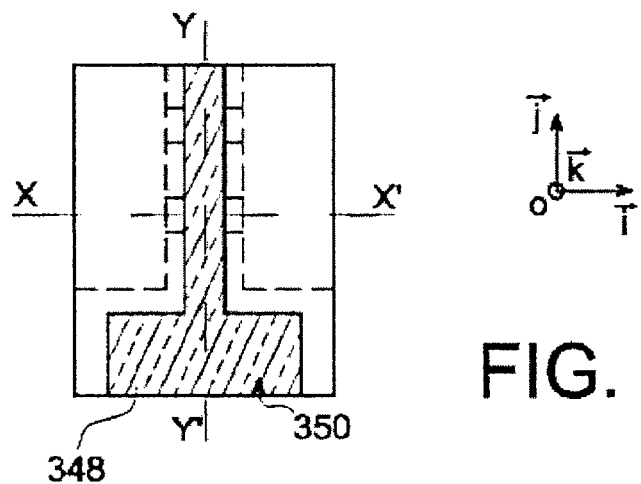
Figure 8F:
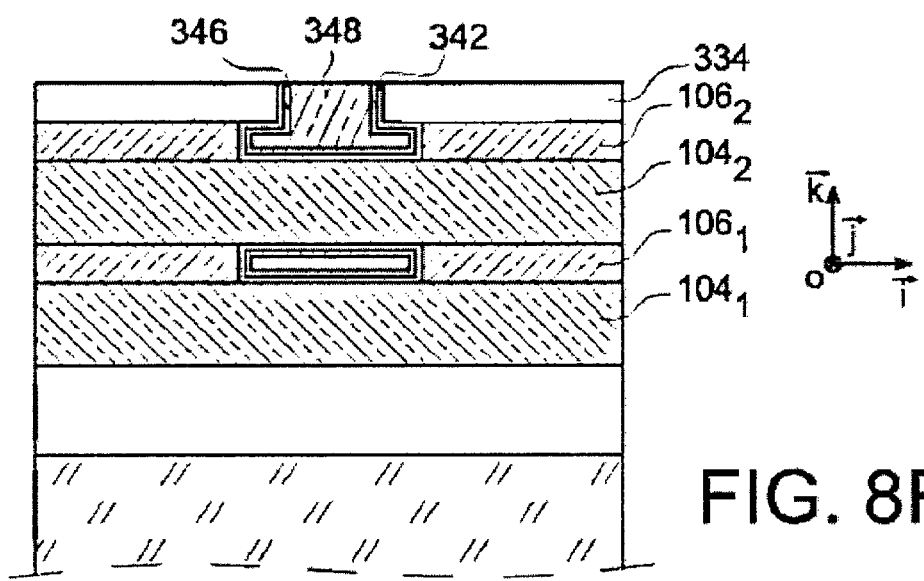
Figure 9F:
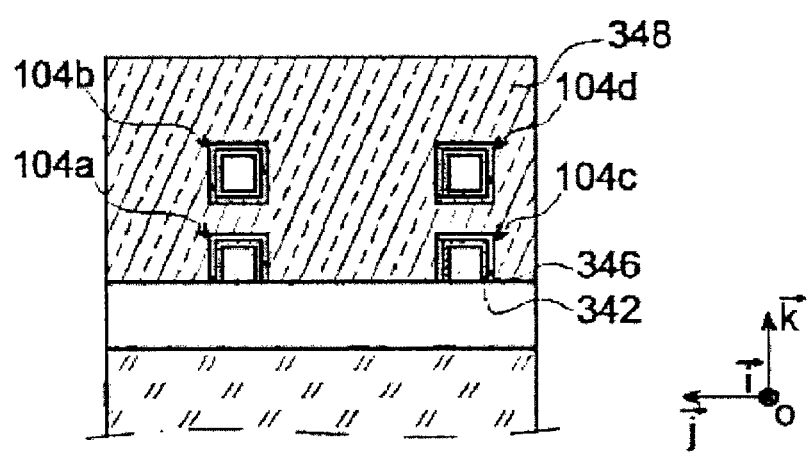

A gate 350 is then made in the cavity 336 using a Damascene method, during which one first deposits a gate dielectric material 342, around the bars 104a, 104b, 104c, 104d, exposed by the cavity 336, then, depositing a metallic material 346, for example TiN, or TaN, or WSi so as to cover the gate dielectric layer 342 around the bars 104a, 104b, 104c, 104d. Then, in the cavity 336 one deposits a gate material 348, which can be semiconductor, such as polysilicon for example. Filling may potentially be followed by a CMP polishing step with a stop on the first insulating layer 132 (FIGS. 7F, 8F, 9F).

Figure 7G:
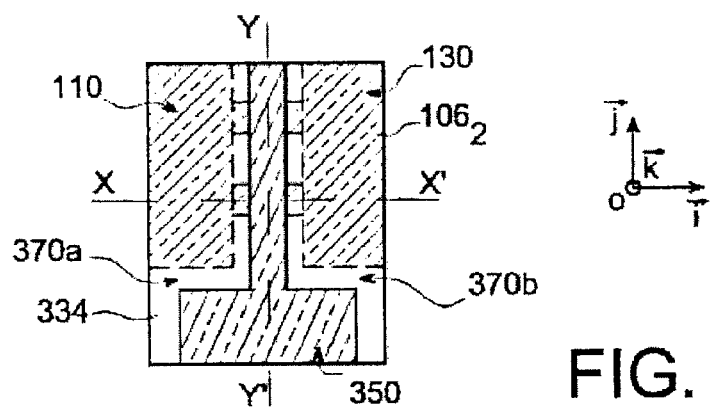
Figure 8G:
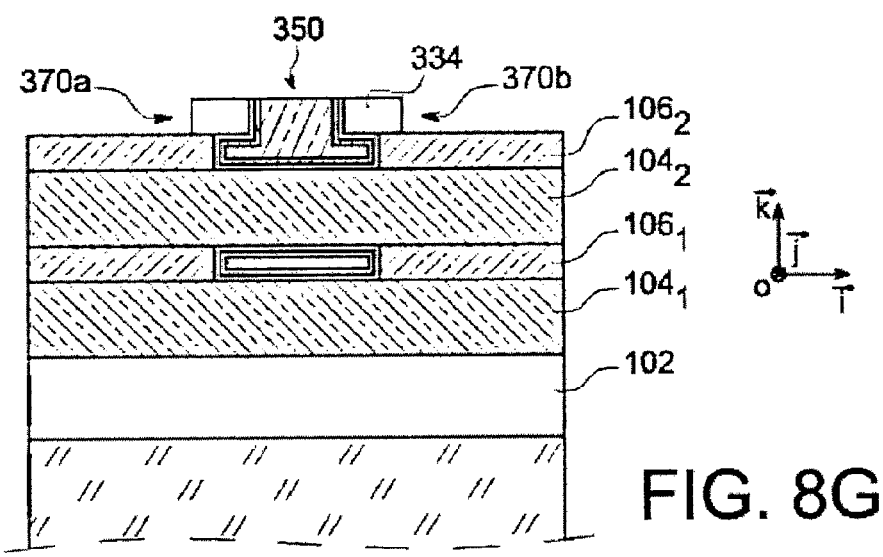
Figure 9G:
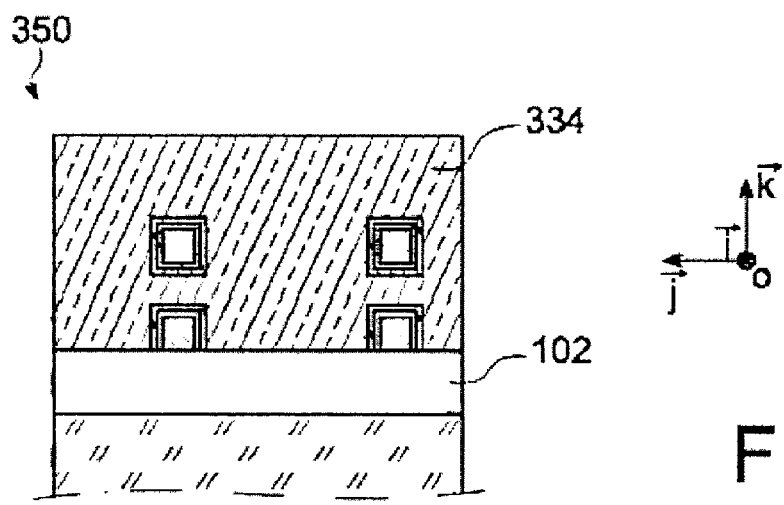

One then produces spacers 370a, 370b, for the gate 350 from the second insulating layer 334, in which the cavity 336 was produced. To do this, one performs a partial removal of the layer 334, for example using anisotropic etching using a plasma, so as to preserve insulating zones 370a and 370b resulting from the second insulating layer 334, on both sides of the gate 350 and separating said gate from the blocks 110 and 130 designed to serve as source region and drain region, respectively (FIGS. 7G, 8G, 9G). The insulating zones 370a and 370b are in contact with the sidewalls of the source and drain semiconductor blocks 110 and 130, possibly on the entire height of these blocks, so as to totally separate the gate 350 from these blocks 110 and 130.

Another embodiment of the microelectronic method will now be given in connection with FIGS. 10A-10F; 11A-11F; 12A-12F (FIGS. 10A-10F showing a top view of a microelectronic device during production, while FIGS. 11A-11F show cross-sectional views of the microelectronic device during production along a cutting plane going through an axis X'X and parallel to a plane [O; $\vec{i}$; $\vec{k}$] of an orthogonal reference [O; $\vec{i}$; $\vec{j}$; $\vec{k}$], and FIGS. 12A-12F show other cross-sectional views of the microelectronic device during production along another cutting plane going through an axis Y'Y and parallel to a plane [O; $\vec{j}$; $\vec{k}$] of an orthogonal reference [O; $\vec{i}$; $\vec{j}$; $\vec{k}$]).

Figure 10A:
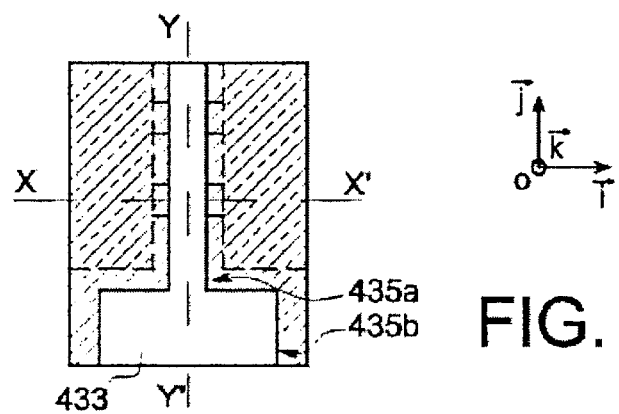
FIGS. 10A to 10F, 11A to 11F, 12A to 12F, illustrate a fourth example of a microelectronic method according to the invention comprising the production of a transistor gate on a multi-branch transistor channel structure, and insulating spacers for this gate.
Figure 11A:
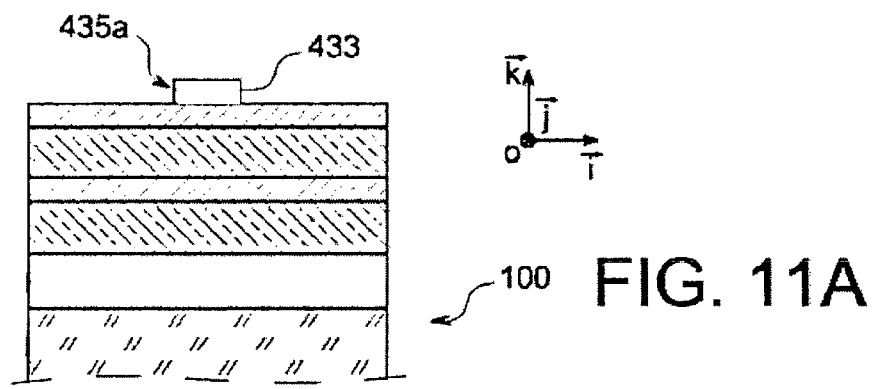
Figure 12A:
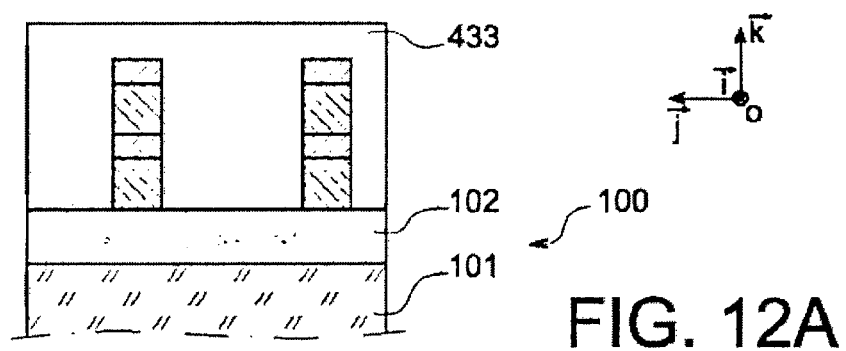

In this example, one produces the stack 105 of thin layers as illustrated in FIGS. 1, 2 and 3, comprising an alternation of layers $104_1$, $104_2$, based on a first semiconductor material such as Si, for example, and layers $106_1$, $106_2$, based on a second material, for example semiconductor such as SiGe. One then etches this stack 105, so as to form the first source region block 110, the second drain region block 130, and the structure 120. One then deposits an insulating layer, for example based on a first dielectric material 433, able to react under the effect of an e-beam, for example an HSQ material. One then produces a dummy gate, or an insulating mask having the shape of a gate pattern 435a and a gate contact pattern 435b, in the material 433, for example through lithography using an e-beam (FIG. 10A, FIG. 11A, FIG. 12A). The use of the e-beam can make it possible to form a specific gate pattern 435a, of critical dimension, for example smaller than 50 nanometers, and uniform.

Figure 10B:
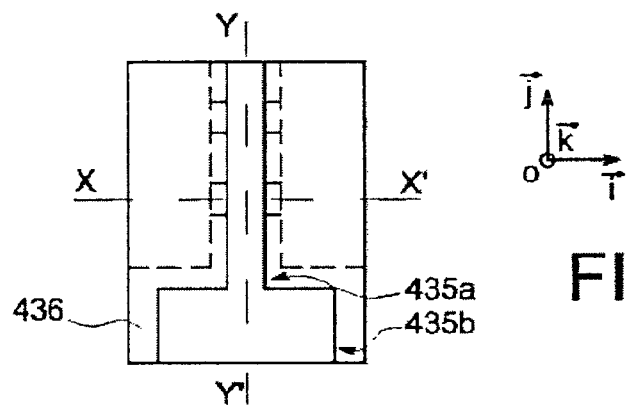
Figure 11B:
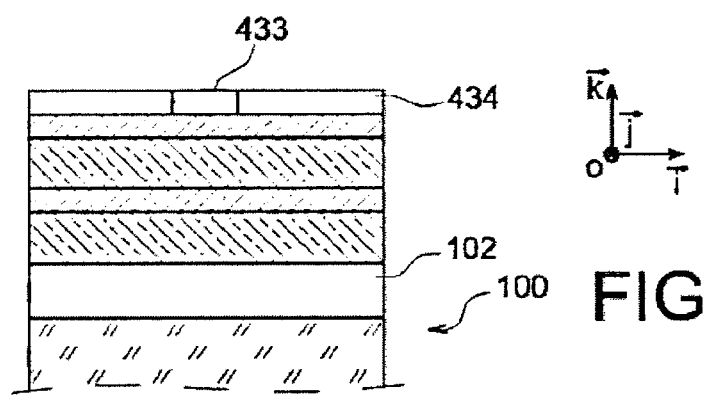
Figure 12B:
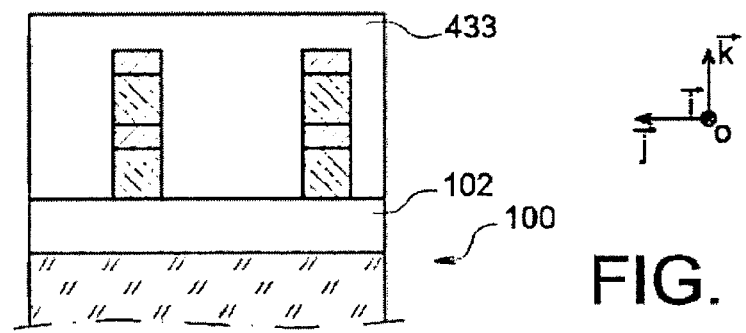

One then deposits a second dielectric material 434 on both sides, and possibly on, the mask. The second dielectric material 434 can for example be based on $Si_3N_4$ or $SiO_2$. One can then reduce the thickness of the second dielectric material 434 and possibly the thickness of the mask, for example using mechanical-chemical polishing. The polishing can be done such that the thickness of the mask based on the first dielectric material 433 and the thickness of the second dielectric material 434 are equal or substantially equal (FIG. 10B, FIG. 11B, FIG. 12B).

Figure 10C:
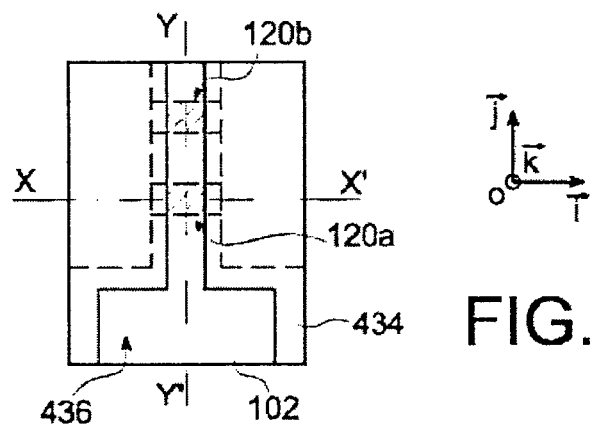
Figure 11C:
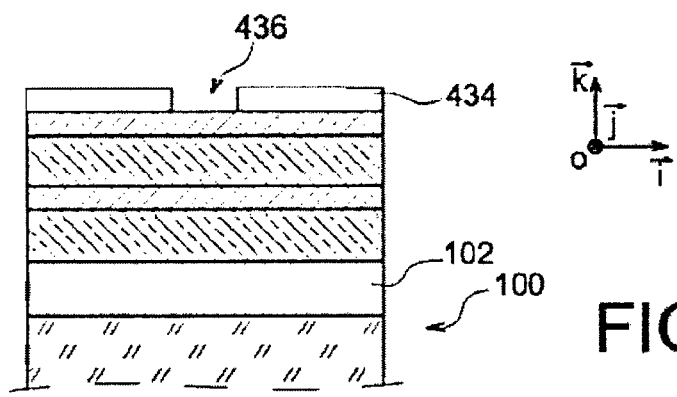
Figure 12C:
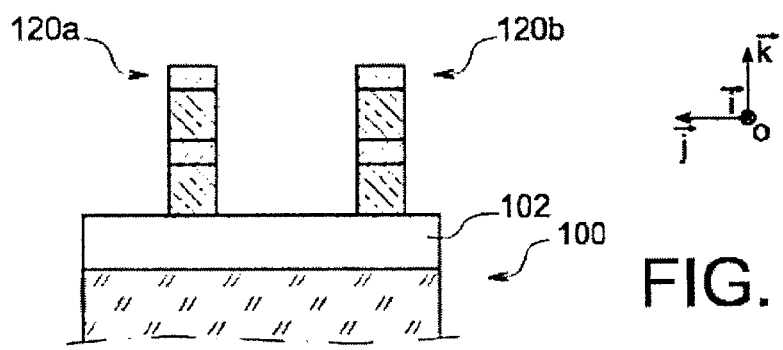

One then removes the mask based on the first dielectric material 433, so as to form a cavity 436 in the layer based on the second dielectric material 434. Removal of the first dielectric material 433 can be done for example by selective etching with regard to the second dielectric material 434, for example isotropic etching using diluted HF having a concentration below 1%. The cavity 436 formed, reproduces the gate 435a and contact 435b patterns, and exposes part of the stacks 120a and 120b of the structure 120 designed to serve as a channel as well as the insulating layer 102 of the substrate 100 (FIG. 10C, FIG. 11C, FIG. 12C).

Figure 10D:
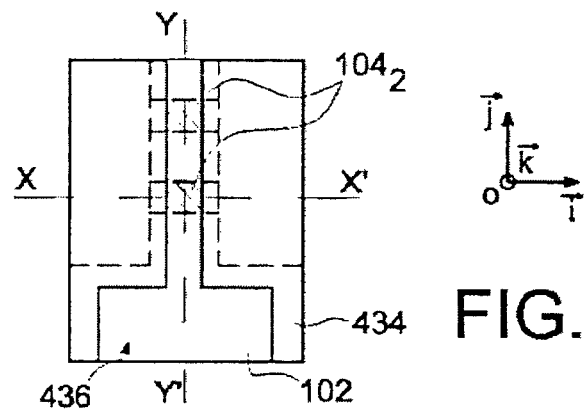
Figure 11D:
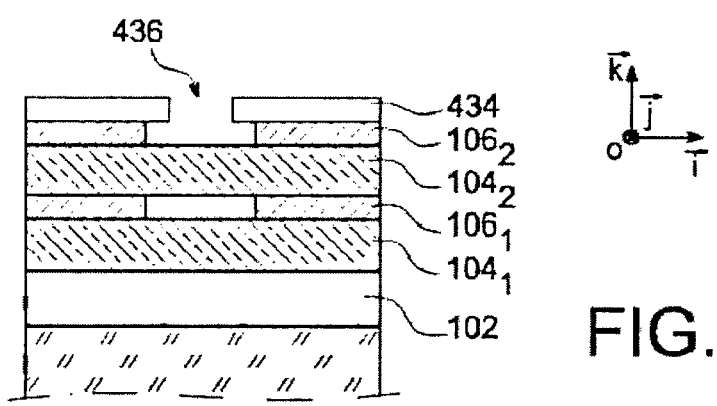
Figure 12D:
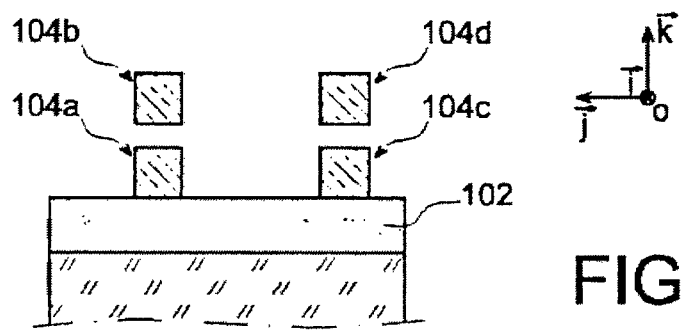

One then removes part of the structure 120 exposed by the cavity, and in particular parts of the layers $106_1$, $106_2$, based on said second material located in the cavity. This removal can be done using isotropic etching of the second material, selective in relation to the first material, so as to form separated semiconductor bars 104a, 104b, 104c, 104d. The etching can be dry etching, for example done using $CF_4$, or wet etching done for example using $HNO_3$:$HF$:$CH_3COOH$:$H_2O$, or SECCO (FIGS. 10D, 11D, 12D).

Figure 10E:
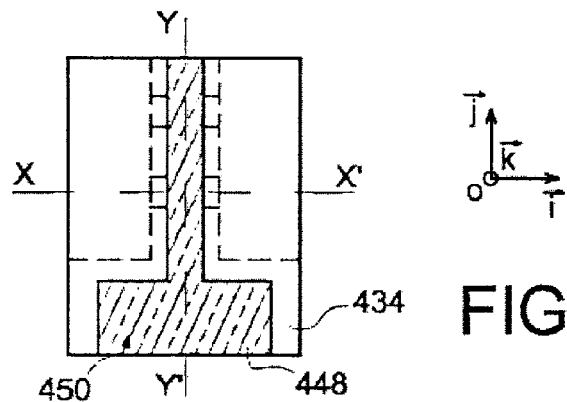
Figure 11E:
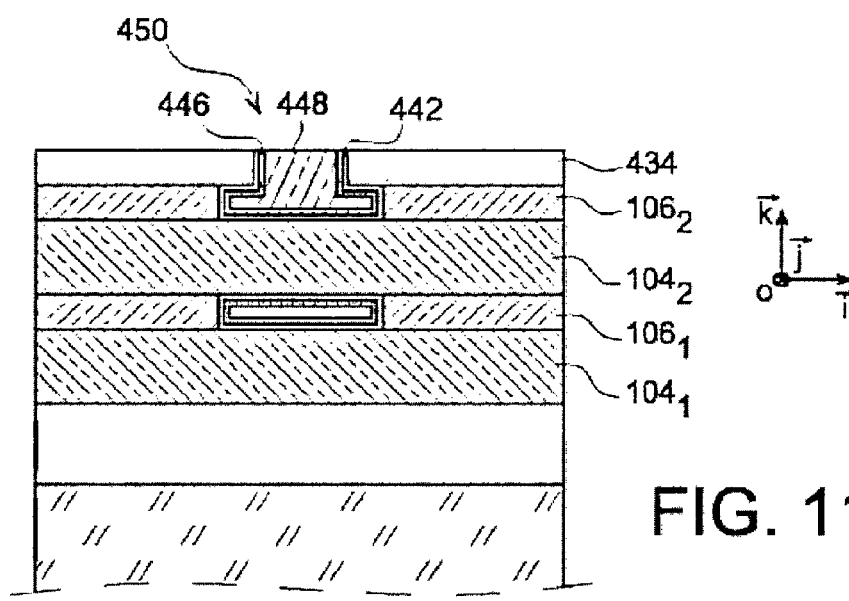
Figure 10F:
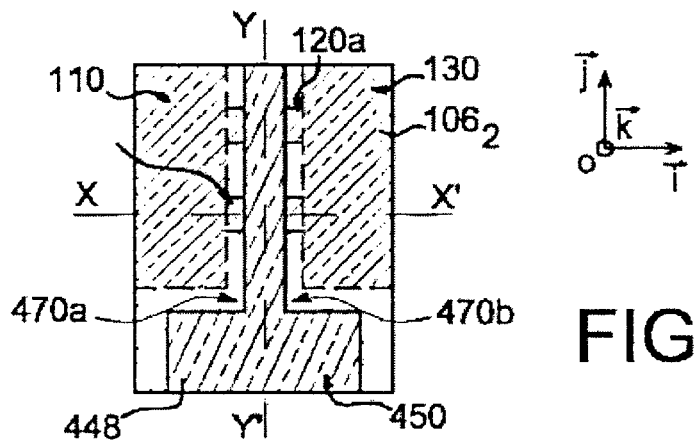
Figure 11F:
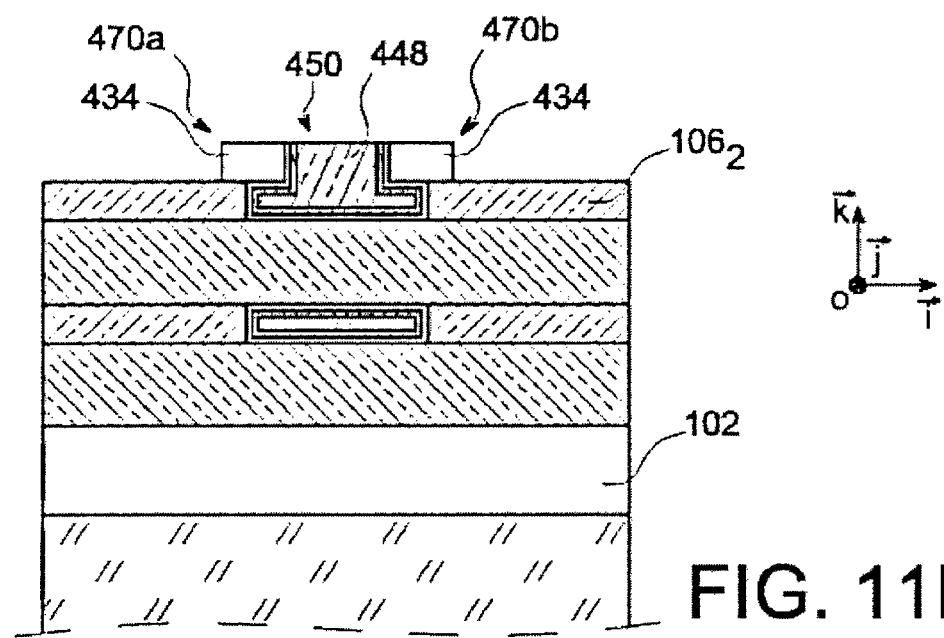
Figure 12E:
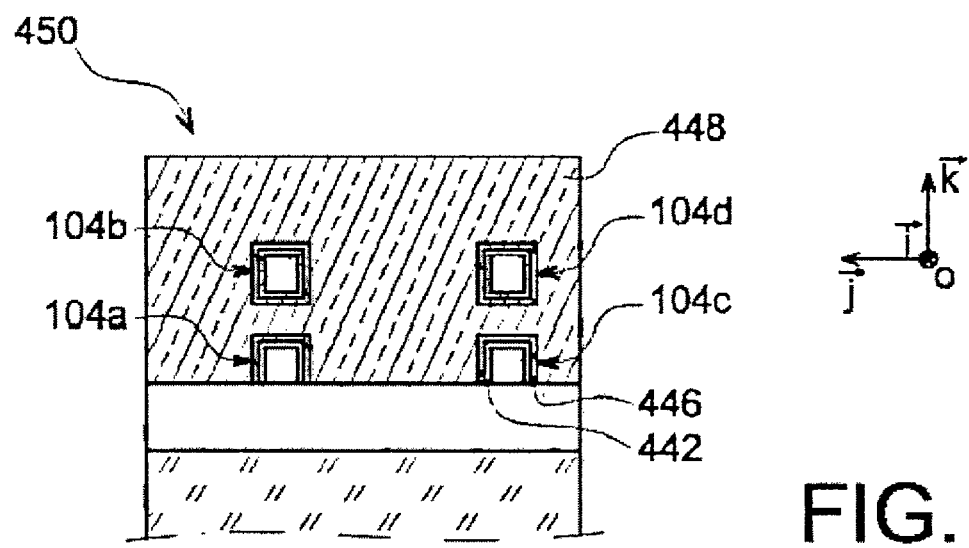
Figure 12F:
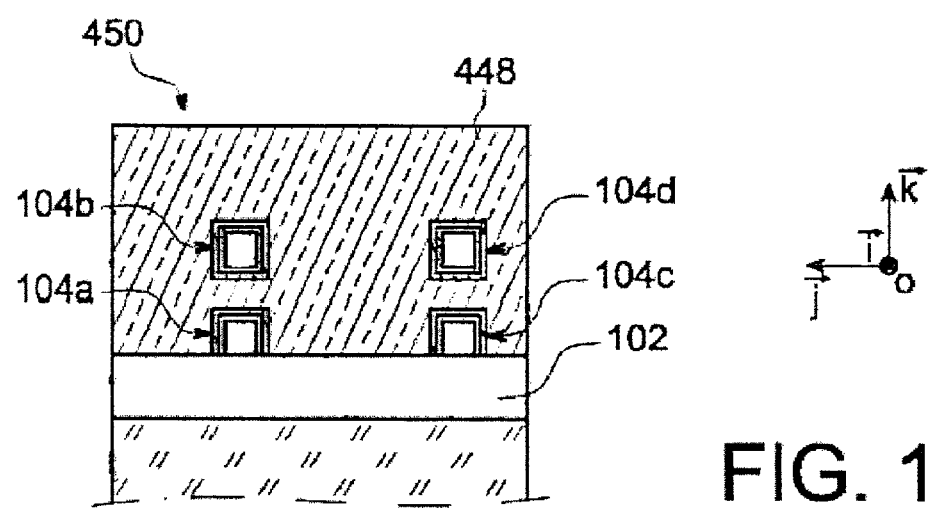

A gate 350 is then produced in the cavity 436 using a Damascene-type method, during which one first deposits a gate dielectric material 442, around bars 104a, 104b, 104c, 104d, exposed by the cavity 436, then depositing a metallic material 446, for example TiN, so as to cover the gate dielectric layer 442 around the bars 104a, 104b, 104c, 104d. Then, the cavity 436 is filled based on a gate material 448, which can be semiconductor, such as polysilicon, for example (FIGS. 10E, 11E, 12E). Filling can potentially be followed by a CMP polishing step.

One then forms spacers 470*a*, 470*b* (FIGS. 10F, 11F, 12F) for the gate 450. For this, one performs a partial removal of the layer 434, in particular on the first block 110 and on the second block 130 as well as on the structure 120. This partial removal can be done for example through anisotropic etching using a plasma, so as to preserve insulating zones 470*a*, 470*b*, based on the second dielectric material, on both sides of the gate 450, separating said gate from the semiconductor blocks 110 and 130 designed to serve as source region and drain region, respectively. The insulating zones 470*a*, 470*b*, rest on the substrate and are formed against the sidewalls of the blocks 110 and 130. The insulating zones 470*a*, 470*b* can be formed against the sidewalls of the blocks 110 and 130 on the entire height thereof, so as to form a total insulating separation between the gate and the semiconductor blocks 110 and 130.

The invention is not limited to the examples of materials which have been provided to form the stacks 105, 205, 1005. The first material based on which the layers $104_1$, $104_2$, $204_1$, $204_2$ are formed can potentially be different from the examples previously given. According to variations, said first semiconductor material such as SiGe or Ge, for example, and/or a strained semiconductor material, for example strained Ge and/or a given semiconductor comprising an additive such as carbon, for example SiGeC or SiC, said additive being in the form of atoms placed in substitution in the network of said given semiconductor and in proportion for example between 1% and 2%.

The second material based on which the sacrificial layers $106_0$, $106_1$, $106_2$, $206_1$, $206_2$, are formed can potentially be different from the examples previously provided. Said second material is different from said first material, for example doped differently and/or based on a different semiconductor, and/or a different stoichiometry than the first material, and chosen so as to be able to be selectively etched in relation to the first material.

In a first case, for example where said first material is Si or Si comprising an additive such as carbon, said second material can potentially be based on SiGe or SiGe comprising an additive such as carbon, or SiGe comprising an additive such as Boron, or doped Si.

In a second case, for example where said first material is SiGe or SiGe comprising an additive such as carbon, said second material can potentially be based on doped SiGe or doped Si or SiGe having a stoichiometry different from that of the first material.

In a third case, for example where said first material is Ge or strained Ge, said second material can potentially be based on SiGe or doped SiGe or stressed Si.

The invention claimed is:

1. A method for fabricating a microelectronic device comprising:
   a) forming, from a stack of thin layers on a support, the stack including at least two successive layers based on at least one first semiconductor material, and at least one second semiconductor material different from the first semiconductor material, respectively, at least one first block configured to form at least one transistor source region, at least one second block configured to form at least one transistor drain region, and at least one structure connecting the first block and the second block;
   b) forming, in a region located between the first block and the second block, at least one first insulating zone against at least one sidewall of the first block and at least one second insulating zone against at least one sidewall of the second block, said first insulating zone and said second insulating zone being arranged to form at least one cavity between them, said cavity forming at least one gate pattern;
   c) removing, in the cavity, the second material, selective with regard to the first material; and
   d) depositing in the cavity at least one gate dielectric and at least one gate material so as to form a gate having said pattern.

2. The method according to claim 1, wherein the cavity also includes at least one transistor gate contact pattern.

3. The method according to claim 1, further comprising, after d), forming at least one transistor gate contact through etching of the gate material.

4. The method according to claim 1, the forming the insulating zones in b) comprising:
   depositing a layer based on a dielectric material on the support; and
   exposing part of the layer of dielectric material using an electron beam.

5. The method according to claim 4, the layer of dielectric material being based on an HSQ dielectric, the forming the insulating zones in b) further comprising, after the exposing, removing the zones of the HSQ dielectric material not exposed to the electron beam.

6. The method according to claim 1, the structure being formed of at least two separated blocks.

7. The method according to claim 1, in which the support includes a dielectric layer on which the stack is formed, the method further comprising: after the forming b), and before the depositing d), partially removing the dielectric layer of the support through the cavity.

8. The method according to claim 1, the stack being formed by an alternation of layers based on the second material and layers based on the first material.

9. The method according to claim 1, the stack including a layer based on the second material in contact with the support.

10. The method according to claim 1, the depositing d) comprising depositing at least one layer of a first metallic gate material on the gate dielectric, then filling the cavity with at least one second semiconductor gate material.

11. The method according to claim 1, the first material or the second material being based on a semiconductor including an additive.

12. The method according to claim 1, the first insulating zone and the second insulating zone being separated, between the first block and the second block, by a constant distance equal to a critical dimension of a gate designed to be formed in the cavity.

13. The method according to claim 1, in which the insulating zones are formed to rest on the support.

14. The method according to claim 1, further comprising at least one operation for doping of the first block and the second block.

15. A method for fabricating a microelectronic device comprising:
   a) forming from a stack of thin layers on a support, the stack including at least two successive layers based on at least one first semiconductor material, and at least one second material different from the first material, respectively: at least one first block configured to form at least one transistor source region and at least one second block configured to form at least one transistor drain region, and at least one structure connecting the first block and the second block;
   b) forming on the stack, an insulating mask including at least one cavity, the cavity including at least one transistor gate pattern;

c) removing through the cavity the second material, selective with regard to the first semiconductor material;

d) depositing in the cavity at least one gate dielectric and at least one gate material; and e) partially removing the insulating mask, so as to preserve at least one first insulating zone resulting from the mask, in contact with the gate material and at least one sidewall of the first block, as well as at least one second insulating zone resulting from the mask, in contact with the gate material and with at least one sidewall of the second block, the gate material being at least partially separated from the first block and the second block via the first insulating zone and the second insulating zone, respectively.

16. The method according to claim 15, the partially removing in e) comprising partial etching of the insulating mask above the first block, the second block, as well as the structure connecting the first block and the second block.

17. The method according to claim 16, wherein the b) forming an insulating mask provided with at least one cavity, comprises:

depositing a first dielectric material;

lithography of the first dielectric material using at least one electron beam, so as to form at least one transistor gate pattern;

forming a second material, on both sides of the base pattern of the first dielectric material; and removing the pattern based on the first dielectric material.

18. The method according to claim 17, the first dielectric material being an HSQ material.

\* \* \* \* \*